(12) United States Patent
Utsugi et al.

(10) Patent No.: US 6,818,324 B1
(45) Date of Patent: *Nov. 16, 2004

(54) ORGANIC THIN-FILM EL DEVICE

(75) Inventors: Koji Utsugi, Tokyo (JP); Hiroshi Tada, Tokyo (JP); Eiichi Kitazume, Tokyo (JP)

(73) Assignee: Samsung SDI Co., Ltd., Suwon (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/167,986

(22) Filed: Oct. 8, 1998

(30) Foreign Application Priority Data

Oct. 9, 1997 (JP) .............................................. 9-277558

(51) Int. Cl.[7] .............................................. H05B 33/00
(52) U.S. Cl. ....................... 428/690; 428/917; 313/498; 313/503; 313/504; 313/506
(58) Field of Search ................................ 428/690, 917; 313/498, 503, 504, 506

(56) References Cited

U.S. PATENT DOCUMENTS 4,950,950 A * 8/1990 Perry et al. .................. 313/504
5,141,671 A * 8/1992 Bryan et al. ............ 252/301.16

(List continued on next page.)

FOREIGN PATENT DOCUMENTS

| EP | 0 765 106 | 3/1997 |
| EP | 0 779 765 | 6/1997 |

(List continued on next page.)

Primary Examiner—Cynthia H. Kelly
Assistant Examiner—Dawn Garrett
(74) Attorney, Agent, or Firm—McGuireWoods, LLP

(57) ABSTRACT

In an organic thin-film EL device of a charge injection type which has an organic thin-film layer contiguous to the surface of the cathode opposite to an anode, said organic thin-film layer is made of an organic compound represented by the following formula (I):

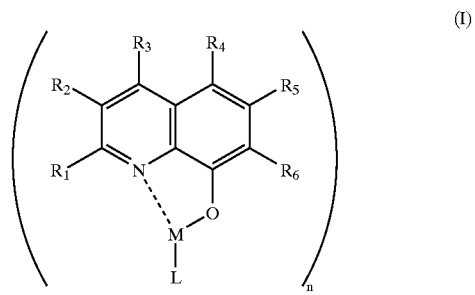

wherein $R_1$ to $R_6$ each independently represents a hydrogen atom, a halogen atom, an alkyl group, an alkoxy group or a cyano group; L represents a group $-OR_7$ in which $R_7$ represents an alkyl group, a cycloalkyl group, an aromatic group which may contain a nitrogen atom, an aromatic group having a bonding group composed of a metal atom or an oxygen atom or a ligand of an oxinoid compound having said bonding group; M represents a metal atom; and n stands for an integer of 1 or 2, and the cathode is made of aluminum containing lithium in an amount of 0.05 to 1.5 wt. %. The organic thin-film EL device according to the present invention has high efficiency and high luminance without a substantial deterioration in the luminance. In addition, it can be fabricated in a high yield.

23 Claims, 10 Drawing Sheets

U.S. PATENT DOCUMENTS

| | | | | |
|---|---|---|---|---|
| 5,150,006 A | * | 9/1992 | Van Slyke et al. | 313/504 |
| 5,294,870 A | * | 3/1994 | Tang et al. | 313/504 |
| 5,429,884 A | * | 7/1995 | Namiki et al. | 428/690 |
| 5,466,392 A | * | 11/1995 | Hironaka et al. | 252/301.16 |
| 5,484,922 A | * | 1/1996 | Moore et al. | 546/7 |
| 5,552,547 A | * | 9/1996 | Shi | 546/7 |
| 5,652,067 A | * | 7/1997 | Ito et al. | 428/690 |
| 5,683,823 A | * | 11/1997 | Shi et al. | 428/690 |
| 5,747,930 A | * | 5/1998 | Utsugi | 313/504 |
| 5,759,444 A | * | 6/1998 | Enokida et al. | 252/301.16 |
| 5,817,431 A | * | 10/1998 | Shi et al. | 428/690 |
| 6,023,073 A | * | 2/2000 | Strite | 257/40 |

FOREIGN PATENT DOCUMENTS

| | | | |
|---|---|---|---|
| JP | 60-165771 | | 8/1985 |
| JP | 1-243393 | | 9/1989 |
| JP | 3-274695 | | 12/1991 |
| JP | 4-19993 | | 1/1992 |
| JP | 4-212287 | | 8/1992 |
| JP | 5-121172 | | 5/1993 |
| JP | 5-198378 | | 8/1993 |
| JP | 5-214332 | | 8/1993 |
| JP | 5-258860 | | 10/1993 |
| JP | 5-258862 | | 10/1993 |
| JP | 5-331460 | | 12/1993 |
| JP | 06145146 | * | 5/1994 |
| JP | 08067873 | * | 8/1994 |
| JP | 9-13026 | | 1/1997 |
| JP | 9-31455 | | 2/1997 |
| JP | 9-95620 | | 4/1997 |
| JP | 9-171892 | | 6/1997 |

* cited by examiner

ORGANIC THIN-FILM EL DEVICE

BACKGROUND OF THE INVENTION

1. Field of the Invention

This invention relates to an organic thin-film EL device, particularly to a cathode of an organic thin-film EL device having light emitting picture elements arranged in the matrix form.

2. Prior Art

An organic thin-film EL device makes use of the phenomenon that holes injected from an anode and electrons injected from a cathode recombine in an emitter layer and emits light after the excitation state. Although various device structures have been studied according to the properties of the light emitting material of the emitter layer, devices can be fabricated principally by sandwiching between the anode and cathode an organic emitter layer which emits strong fluorescence. For the heightening of luminous efficiency and stable operation, it is considered effective to dispose a charge transport layer such as hole injection transport layer or electron injection transport layer or to carry out doping of guest molecules into an organic emitter layer. Furthermore, electrode materials, particularly, cathode materials are under investigation with a view to improving the luminous efficiency or lifetime properties.

As a cathode, it is effective to employ an alloy metal having a work function as low as possible. It is reported that from an organic thin-film EL device using, among various alloy metals, lithium-containing aluminum having a low work function, light emission of high efficiency, high luminance and long lifetime is available.

For example, it is reported in Japanese Patent Application Laid-Open No. 165771/1985 that in an organic thin film having an emitter layer, which is contiguous to a cathode, made of anthracene, light emission with high efficiency is available when an aluminum-lithium alloy or magnesium-lithium alloy is used as a cathode. It is also reported that the optimum content of lithium in the alloy is 1 to 99 wt. %, preferably 10 to 50 wt. %.

On page 6 of Japanese Patent Application Laid-Open No. 212287/1992, it is reported that light emission with higher luminance can be attained using tris(8-quinolinol) aluminum (which will hereinafter be abbreviated as "Alq") as an electron transport emitter layer contiguous to a cathode and as the cathode, an alloy containing at least 6 mole % of an alkali metal (for example, an aluminum alloy containing 28 mole % of lithium or magnesium-lithium alloy).

In Japanese Patent Application Laid-Open No. 121172/1993, it is reported that light emission with high efficiency and long lifetime and EL emission with high environmental stability can be attained in the case where a lithium-aluminum alloy is used as a cathode contiguous to an organic fluorescent thin film made of Alq and this alloy has a lithium concentration of 0.01 to 0.1 wt. %.

Thus, in an organic thin-film EL device having a cathode made of a lithium-containing alloy, it is considerably important to select a suitable concentration range of lithium to be incorporated in the cathode in accordance with an organic material adjacent to the cathode with a view to imparting the organic thin-film EL device with excellent efficiency and lifetime properties and high environmental resistance.

An organic thin-film EL device which uses a cathode material containing lithium within a certain composition range exhibits light emission of relatively high luminance and high efficiency.

In the case where Alq is used as an emitter layer, since Alq emits a green light, light emission on the shorter-wavelength side than it (for example, blue light emission) is not available even by doping into the emitter layer made of Alq. In the case where Alq is used as an electron transport layer, the use of an emitter layer having a large excitation energy or charge injection level (ex. blue-light emitting material) does not permit the sufficient closure of excited electrons or charges, which makes it difficult to attain sufficient luminous efficiency or luminance. The compound of the formula (I) which will be described later is used in this invention in view of such defects.

The above-described composition range of lithium is used only when an organic thin-film layer adjacent to a cathode is a specific compound (ex. Alq). If an organic thin film made of the compound as represented by the below-described formula (I) is used as an organic thin-film layer adjacent to a cathode, lithium of the above-described composition range does not bring about sufficient luminous efficiency or increases a luminance lowering rate while the resulting element is driven. Such disadvantages occur because the electron injection level of the organic thin film varies depending on the organic material to be employed so that the injection efficiency of electrons is presumed to be insufficient in a known lithium concentration range; and because adhesion between the organic thin film and cathode is weak in the known lithium concentration range, which lowers the electron injection efficiency and makes it difficult to attain stable light emission.

SUMMARY OF THE INVENTION

An object of the present invention is therefore to provide an organic thin-film EL device which has high efficiency and high luminance, is free from a substantial deterioration in the luminance and has a high yield when producing the same.

The present inventors have found that an organic thin-film EL device having high luminous efficiency (luminance per current density) and has long lifetime can be obtained using an aluminum alloy containing lithium in a concentration range of 0.05 to 1.5 wt. % as a cathode for the organic thin-film EL device wherein an organic thin film layer adjacent to the cathode contains an organic compound represented by the below-described formula (I).

In the present invention, there is thus provided an organic thin-film EL device of a charge injection type which has an organic thin film layer adjacent to the surface of a cathode opposite to an anode, said organic thin film layer containing an organic compound represented by the following formula (I):

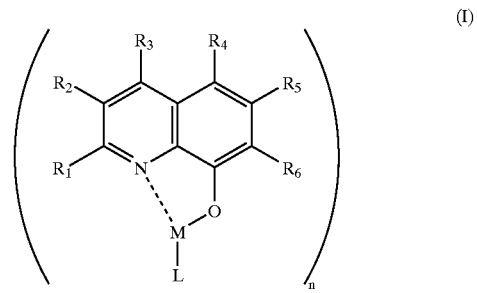

wherein $R_1$ to $R_6$ each independently represents a hydrogen atom, a halogen atom, an alkyl group, an alkoxy group or a cyano group; L represents a group —$OR_7$ in which $R_7$ representing an alkyl group, a cycloalkyl group, an aromatic group which may contain a nitrogen atom, an aromatic group having a bonding group composed of a metal atom or an oxygen atom, or a ligand of an oxinoid compound having said bonding group; M represents a metal atom; and n stands for an integer of 1 or 2, said cathode comprising aluminum as a main component and lithium in an amount of 0.05 to 1.5 wt. %.

In another aspect of the present invention, there is also provided an organic thin-film EL device of a charge injection type having an organic thin-film layer adjacent to the surface of a cathode opposite to an anode, said organic thin-film layer containing an organic compound represented by the above-described formula (I) and said cathode comprising magnesium as a main component and lithium in an amount of 0.03 to 1.7 wt. %.

The present invention makes it possible to heighten the basic properties of the device such as luminous efficiency and lifetime.

In addition, lithium is contained in the aluminum alloy cathode of the present invention in a concentration range as wide as from 0.05 to 1.5 wt. % so that even a slight difference in the lithium composition does not have a large influence on the properties of the device, which makes it possible to fabricate an organic thin-film EL device in a high yield, more specifically, to widen the area of the device without losing uniform luminance and efficiency. Furthermore, neither corrosion nor black spot appears on the cathode easily.

On the other hand, lithium is contained in the magnesium alloy cathode of the present invention in a concentration range as wide as from 0.03 to 1.7 wt. % so that similar advantages as described above can be obtained and neither corrosion nor black spot occurs easily on the cathode.

Figure 1:
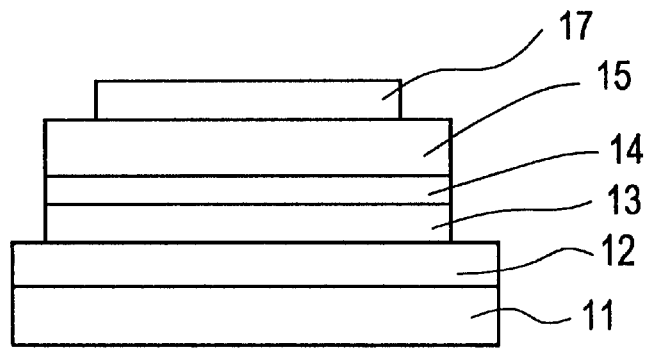
FIG. 1 is a schematic cross-sectional view illustrating an organic thin-film EL device of the present invention wherein an organic thin-film layer adjacent to a cathode is an emitter layer.

In each diagram, indicated at numeral 11 is a substrate, 12 an anode, 13 a hole injection layer, 14 a hole transport layer, 15 an emitter layer, 16a an electron injection transport layer of an organic thin-film made of the compound of the formula (I), 16b an electron injection transport layer of an organic thin-film which is made of the compound of the formula (I) and has at least one cathode component doped therein, 17 a cathode and 18 a cathode protective layer.

PREFERRED EMBODIMENTS OF THE INVENTION

In one embodiment of the present invention, when an organic thin-film layer containing the compound of the formula (I) is brought into contact with a cathode made of an aluminum-lithium alloy, a lithium concentration not less than 0.05 wt. % in the alloy is sufficiently effective for improving luminous efficiency and lifetime properties. At a lithium concentration not less than 0.05 wt. %, neither a marked reduction in luminous efficiency nor noticeably rapid lowering in luminance when operating the same is observed. This owes to the following reasons: while the use of an organic thin film containing the compound of the formula (I) heightens an electron injection level when compared with the use of conventional Alq and is therefore disadvantageous in the injection of electrons at a conventional lithium concentration, the injection of electrons is carried out sufficiently at a lithium concentration not less than 0.05 wt. %; and while the adhesion between the organic thin film containing the compound of the formula (I) and a cathode having the conventional lithium concentration is insufficient, sufficient adhesion can be obtained at a lithium concentration not less than 0.05 wt. %. On the other hand, the upper limit of the lithium concentration is controlled to 1.5 wt. % in the present invention, whereby environmental resistance can be maintained sufficiently. Lithium is considerably corrodible in the air, but the lithium concentration in the aluminum alloy not greater than 1.5 wt. % makes it possible not only to suppress the corrosion-induced lowering in luminous efficiency or lifetime properties but also to suppress the growth of black spots. Accordingly, the lithium concentration suitably ranges from 0.05 to 1.5 wt. %, preferably 0.1 to 0.5 wt. %, more preferably 0.15 to 0.5 wt. %.

Aluminum to be alloyed with lithium and used as a cathode material may be in the form of a single substance or alloy. As an alloy, a known aluminum alloy can be employed insofar as it does not cause an essential deterioration in the properties of aluminum. In this case, the content of aluminum is preferably 80 wt. % or greater, with 90 wt. % or greater being particularly preferred. Examples of such an aluminum alloy include aluminum-scandium, aluminum-silicon, aluminum-copper, aluminum-magnesium and aluminum-cerium.

In another aspect of the present invention, when an organic thin-film layer represented by the formula (I) is brought into contact with a cathode made of a magnesium-lithium alloy, sufficient effects can be obtained at the lithium concentration in the alloy not less than 0.03 wt. %. When the lithium concentration is not less than 0.03 wt. %, not only sufficient luminous efficiency can be obtained but also a noticeably rapid lowering in luminance when operating the same is not observed. This is because the adhesion between the organic thin film containing the compound of the formula (I) and the magnesium cathode having a lithium concentration not less than 0.03 wt. % becomes sufficient. When the upper limit of the lithium concentration is set at 1.7 wt. %, sufficient environmental resistance can be maintained. Lithium is considerably corrodible in the air, but the lithium concentration in the magnesium alloy not greater than 1.7 wt. % makes it possible not only to suppress the corrosion-induced lowering in luminous efficiency or lifetime properties but also to suppress the growth of a black spot. Accordingly, the lithium concentration range suitably ranges from 0.03 to 1.7 wt. %, preferably 0.03 to 1.0 wt. %, more preferably 0.4 to 1.0 wt. %.

Magnesium to be alloyed with lithium and used as a cathode material may be in the form of a single substance or alloy. As an alloy, a known magnesium alloy can be employed insofar as it does not cause an essential deteriorate in the properties of magnesium. In this case, the content of magnesium is preferably 80 wt. % or greater. Examples of such a magnesium alloy include magnesium-aluminum, magnesium-indium and magnesium-silver. The organic thin-film EL device to which the cathode of the present invention is applicable can be imparted with excellent storage stability and physical resistance by disposing a cathode protective layer on the cathode of the present invention.

When the cathode protective layer is disposed on the cathode of the present invention, the cathode is preferred to have a thickness of 1 to 50 nm. If the cathode has a thickness not less than 1 nm, the organic thin-film layer can be covered completely with the above-described cathode material. The organic thin-film layer can be covered sufficiently with the cathode component when its thickness is 50 nm. An unnecessarily thick cathode is not preferred because it thickens the whole device.

As the cathode protective layer to be formed on the cathode, an aluminum single substance or aluminum alloy is preferred because it is inexpensive, has excellent corrosion resistance and processability and can provide a low sheet resistance. When an aluminum alloy is used as the cathode protective layer, preferred examples of the substance contained in the alloy include scandium, silicon, manganese and copper from the viewpoints of ease of alloy formation and stability of film formation. Particularly in the fabrication and operation of an organic thin-film EL device or an organic thin-film EL device wherein electrodes are interconnected in the form of matrix (for example, active matrix operation type display), there is room for the improvement of the physical strength in the case of a single aluminum substance. Described specifically, addition of the above-described substance can suppress thermal expansion, thereby improving the physical strength, and particularly when the luminance is large (in other words, when the heat evolution due to light emission is large), not only step breakage but also local unevenness and cracks show a marked decrease. The above-described substance provides apparent advantages when added in an amount of 0.1 to 5 mole % based on an alloy to be formed as the protective layer, because amounts not less than 0.1 mole % have a sufficient influence on various properties such as thermal expansion coefficient, when compared with aluminum alone. Amounts not greater than 5 mole %, on the other hand, prevent occurrence of phase separation between aluminum and the substance. The cathode protective layer is desired to have a thickness of 50 to 3000 nm with a view to preventing the influence of oxygen or moisture on the cathode.

In the present invention, doping of at least one alloy component contained in the cathode or cathode protective layer into an organic thin film (film containing the compound of the formula (I)) contiguous to the cathode brings about an improvement in the luminous efficiency and at the same time is effective for excellent adhesion and improvement in the operation stability (Japanese Patent Application Laid-Open Nos. 243393/1989 and 274695/1991, Preprints of Lecture on the 44-th Spring Meeting of the Japan Society of Applied Physics and Related Society, 1154, 29p-NK-8 (1997).

In the present invention, the most apparent advantages can be obtained when the organic thin film layer contiguous to the cathode is an emitter layer or an electron injection transport layer.

The compound represented by the formula (I) is preferred to be contained in an amount not less than 95 mole % in the organic thin film layer contiguous to the cathode. It the amount is not less than 95 mole %, no marked deterioration in properties due to impurities or the like occurs and the object of the present invention can be attained sufficiently.

When the compound of the formula (I) has an alkyl or alkoxy group as $R_1$ to $R_2$, the number of carbon atoms is preferably 1 to 6, with 1 to 4 being particularly preferred. When $R_7$ represents an alkyl group, the number of carbon atoms is preferably 1 to 6, with 1 to 4 being particularly preferred.

Examples of the compound represented by the formula (I) include organic metal complexes containing an oxinoid ligand as disclosed in Japanese Patent Application Laid-Open Nos. 214332/1993, 258860/1993, 258862/1993, 198378/1993, 331460/1993, 95620/1997, 13026/1997 and 31455/1997 and European Patent Publication Nos. 765106 and 779765. According to them, these compounds are usable as an emitter layer or electron injection and transport layer.

Specific examples of the compound of the formula (I) include, but not limited to, those shown in Tables 1 to 18.

TABLE 1
| Compound | n | $R_1$ | $R_2$ | $R_3$ | $R_4$ | $R_5$ | $R_6$ | M | L |
|---|---|---|---|---|---|---|---|---|---|
| (1) | 2 | —CH$_3$ | H | H | H | H | H | Al | 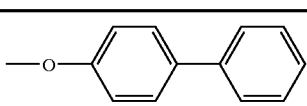 |
| (2) | 2 | —CH$_3$ | H | H | H | H | H | Al | 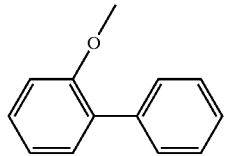 |
| (3) | 2 | —CH$_3$ | H | H | H | H | H | Al | 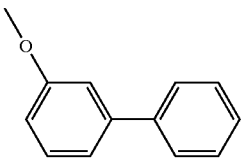 |
| (4) | 2 | —CH$_3$ | H | H | H | H | H | Al | 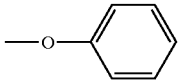 |
| (5) | 2 | —CH$_3$ | H | H | H | H | H | Al | 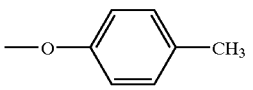 |
| (6) | 2 | —CH$_3$ | H | H | H | H | H | Al | 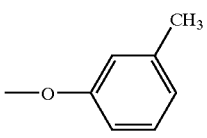 |
| (7) | 2 | —CH$_3$ | H | H | H | H | H | Al | 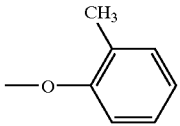 |
| (8) | 2 | —CH$_3$ | H | H | H | H | H | Al | 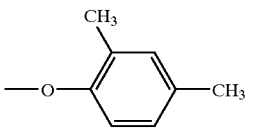 |
| (9) | 2 | —CH$_3$ | H | H | H | H | H | Al | 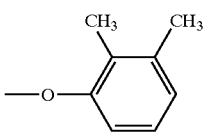 |
| (10) | 2 | —CH$_3$ | H | H | H | H | H | Al | 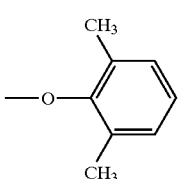 |
| (11) | 2 | —CH$_3$ | H | H | H | H | H | Al | 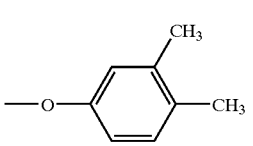 |

TABLE 1-continued
| Compound | n | R₁ | R₂ | R₃ | R₄ | R₅ | R₆ | M | L |
|---|---|---|---|---|---|---|---|---|---|
| (12) | 2 | —CH₃ | H | H | H | H | H | Al | 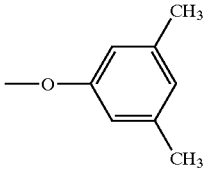 |
TABLE 2
| Compound | n | R₁ | R₂ | R₃ | R₄ | R₅ | R₆ | M | L |
|---|---|---|---|---|---|---|---|---|---|
| (13) | 2 | —CH₃ | H | H | H | H | H | Al | 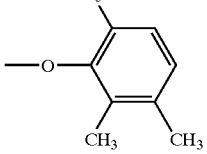 |
| (14) | 2 | —CH₃ | H | H | H | H | H | Al | 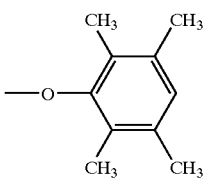 |
| (15) | 2 | —CH₃ | H | H | H | H | H | Al | 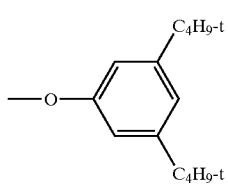 |
| (16) | 2 | —CH₃ | H | H | H | H | H | Al | 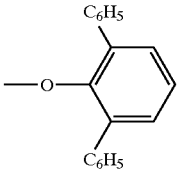 |
| (17) | 2 | —CH₃ | H | H | H | H | H | Al | 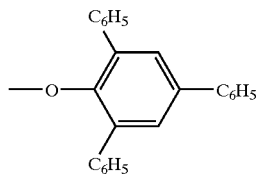 |
| (18) | 2 | —CH₃ | H | H | H | H | H | Al | 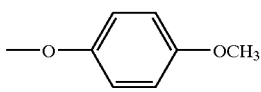 |

TABLE 2-continued
| Compound | n | R₁ | R₂ | R₃ | R₄ | R₅ | R₆ | M | L |
|---|---|---|---|---|---|---|---|---|---|
| (19) | 2 | —CH₃ | H | H | H | H | H | Al | 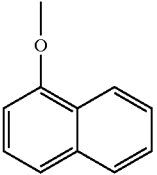 |
| (20) | 2 | —CH₃ | H | H | H | H | H | Al | 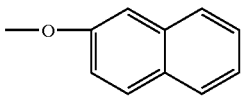 |
| (21) | 2 | —CH₃ | H | H | H | H | H | Al | Cl |
| (22) | 2 | —C₂H₅ | H | H | H | H | H | Al | 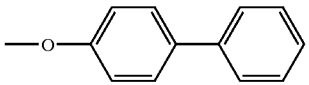 |
| (23) | 2 | —C₂H₅ | H | H | H | H | H | Al | 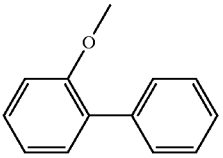 |
TABLE 3
| Compound | n | R₁ | R₂ | R₃ | R₄ | R₅ | R₆ | M | L |
|---|---|---|---|---|---|---|---|---|---|
| (24) | 2 | —C₂H₅ | H | H | H | H | H | Al | 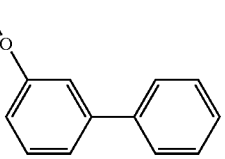 |
| (25) | 2 | —C₂H₅ | H | H | H | H | H | Al | 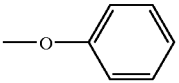 |
| (26) | 2 | —C₂H₅ | H | H | H | H | H | Al | 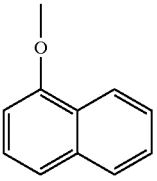 |
| (27) | 2 | —C₂H₅ | H | H | H | H | H | Al | 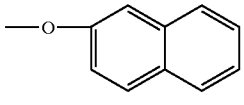 |
| (28) | 2 | —C₂H₅ | H | H | H | H | H | Al | Cl |
| (29) | 2 | H | H | H | Cl | H | Cl | Al | 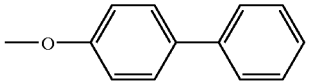 |

TABLE 3-continued
| Compound | n | R₁ | R₂ | R₃ | R₄ | R₅ | R₆ | M | L |
|---|---|---|---|---|---|---|---|---|---|
| (30) | 2 | H | H | H | Cl | H | Cl | Al | 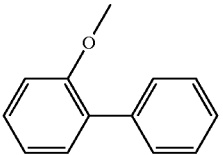 |
| (31) | 2 | H | H | H | Cl | H | Cl | Al | 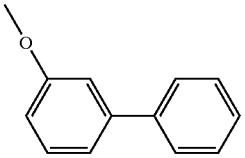 |
| (32) | 2 | H | H | H | Cl | H | Cl | Al | 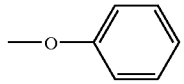 |
| (33) | 2 | H | H | H | Cl | H | Cl | Al | 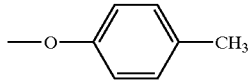 |
| (34) | 2 | H | H | H | Cl | H | Cl | Al | 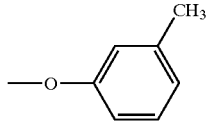 |
| (35) | 2 | H | H | H | Cl | H | Cl | Al | 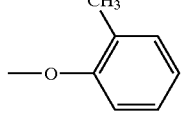 |
| (36) | 2 | H | H | H | Cl | H | Cl | Al | 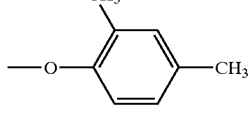 |
| (37) | 2 | H | H | H | Cl | H | Cl | Al | 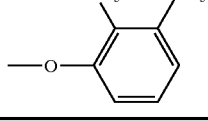 |
TABLE 4
| Compound | n | R₁ | R₂ | R₃ | R₄ | R₅ | R₆ | M | L |
|---|---|---|---|---|---|---|---|---|---|
| (38) | 2 | H | H | H | Cl | H | Cl | Al | 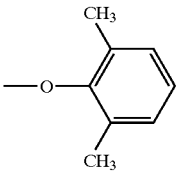 |

TABLE 4-continued
| Compound | n | $R_1$ | $R_2$ | $R_3$ | $R_4$ | $R_5$ | $R_6$ | M | L |
|---|---|---|---|---|---|---|---|---|---|
| (39) | 2 | H | H | H | Cl | H | Cl | Al | 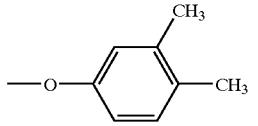 |
| (40) | 2 | H | H | H | Cl | H | Cl | Al | 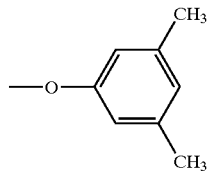 |
| (41) | 2 | H | H | H | Cl | H | Cl | Al | 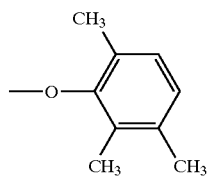 |
| (42) | 2 | H | H | H | Cl | H | Cl | Al | 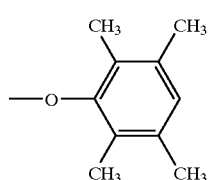 |
| (43) | 2 | H | H | H | Cl | H | Cl | Al | 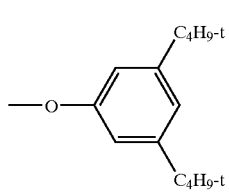 |
| (44) | 2 | H | H | H | Cl | H | Cl | Al | 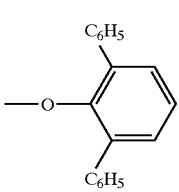 |
| (45) | 2 | H | H | H | Cl | H | Cl | Al | 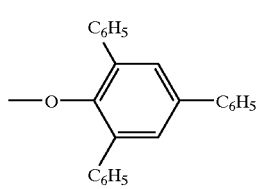 |
| (46) | 2 | H | H | H | Cl | H | Cl | Al | 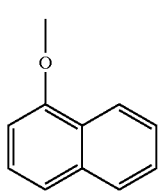 |

TABLE 5
| Compound | n | $R_1$ | $R_2$ | $R_3$ | $R_4$ | $R_5$ | $R_6$ | M | L |
|---|---|---|---|---|---|---|---|---|---|
| (47) | 2 | H | H | H | Cl | H | Cl | Al | 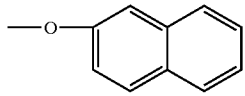 |
| (48) | 2 | $CH_3$ | H | H | Cl | H | Cl | Al | 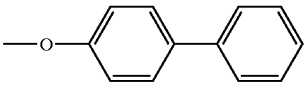 |
| (49) | 2 | $CH_3$ | H | H | Cl | H | Cl | Al | 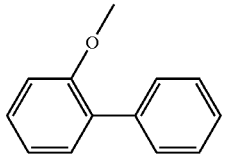 |
| (50) | 2 | $CH_3$ | H | H | Cl | H | Cl | Al | 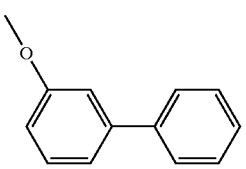 |
| (51) | 2 | $CH_3$ | H | H | Cl | H | Cl | Al | 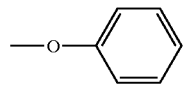 |
| (52) | 2 | $CH_3$ | H | H | Cl | H | Cl | Al | 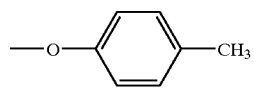 |
| (53) | 2 | $CH_3$ | H | H | Cl | H | Cl | Al | 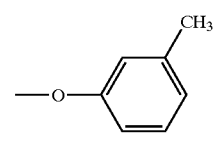 |
| (54) | 2 | $CH_3$ | H | H | CN | H | H | Al | 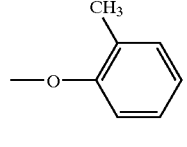 |
| (55) | 2 | $CH_3$ | H | H | CN | H | H | Al | 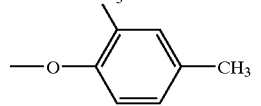 |
| (56) | 2 | $CH_3$ | H | H | Cl | H | Cl | Al | 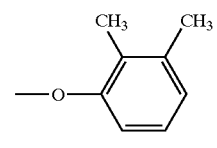 |
| (57) | 2 | $CH_3$ | H | H | Cl | H | Cl | Al | 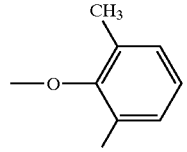 |

TABLE 5-continued
| Compound | n | $R_1$ | $R_2$ | $R_3$ | $R_4$ | $R_5$ | $R_6$ | M | L |
|---|---|---|---|---|---|---|---|---|---|
| (58) | 2 | $CH_3$ | H | H | Cl | H | Cl | Al | 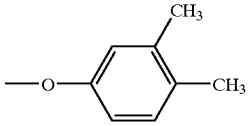 |
| (59) | 2 | $CH_3$ | H | H | Cl | H | Cl | Al | 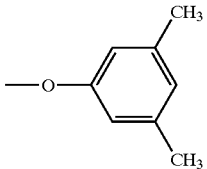 |
TABLE 6
| Compound | n | $R_1$ | $R_2$ | $R_3$ | $R_4$ | $R_5$ | $R_6$ | M | L |
|---|---|---|---|---|---|---|---|---|---|
| (60) | 2 | $CH_3$ | H | H | Cl | H | Cl | Al | 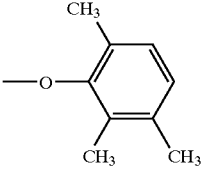 |
| (61) | 2 | $CH_3$ | H | H | Cl | H | Cl | Al | 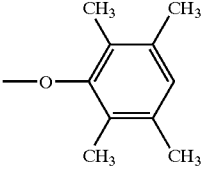 |
| (62) | 2 | $CH_3$ | H | H | Cl | H | Cl | Al | 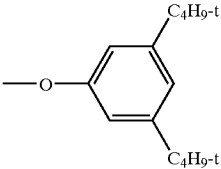 |
| (63) | 2 | $CH_3$ | H | H | Cl | H | Cl | Al | 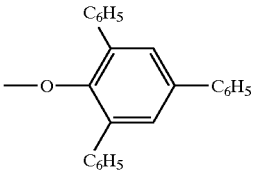 |
| (64) | 2 | $CH_3$ | H | H | Cl | H | Cl | Al | 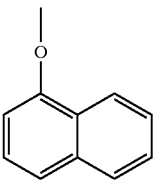 |
| (65) | 2 | $CH_3$ | H | H | H | $CF_3$ | H | Al | 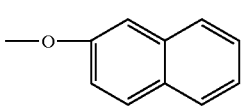 |

TABLE 6-continued
| Compound | n | R₁ | R₂ | R₃ | R₄ | R₅ | R₆ | M | L |
|---|---|---|---|---|---|---|---|---|---|
| (66) | 2 | CH₃ | H | H | H | H | H | In | 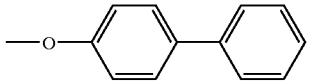 |
| (67) | 2 | CH₃ | H | H | H | H | H | In | 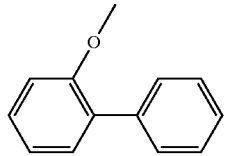 |
| (68) | 2 | CH₃ | H | H | H | H | H | In | 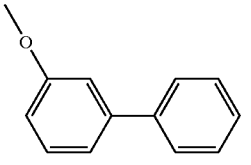 |
| (69) | 2 | CH₃ | H | H | H | H | H | In | 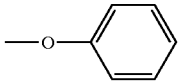 |
| (70) | 2 | CH₃ | H | H | H | H | H | In | 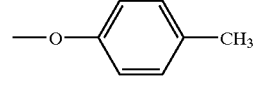 |
TABLE 7
| Compound | n | R₁ | R₂ | R₃ | R₄ | R₅ | R₆ | M | L |
|---|---|---|---|---|---|---|---|---|---|
| (71) | 2 | CH₃ | H | H | H | H | H | In | 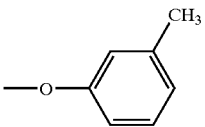 |
| (72) | 2 | CH₃ | H | H | H | H | H | In | 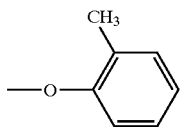 |
| (73) | 2 | CH₃ | H | H | H | H | H | In | 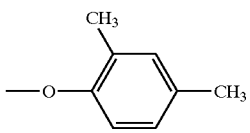 |
| (74) | 2 | CH₃ | H | H | H | H | H | In | 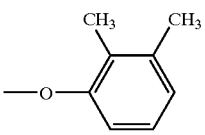 |

TABLE 7-continued
| Compound | n | R₁ | R₂ | R₃ | R₄ | R₅ | R₆ | M | L |
|---|---|---|---|---|---|---|---|---|---|
| (75) | 2 | CH₃ | H | H | H | H | H | In | 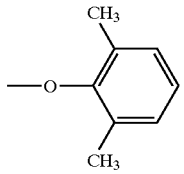 |
| (76) | 2 | CH₃ | H | H | H | H | H | In | 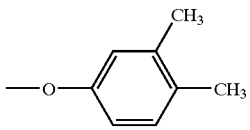 |
| (77) | 2 | CH₃ | H | H | H | H | H | In | 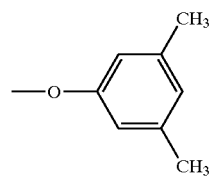 |
| (78) | 2 | CH₃ | H | H | H | H | H | In | 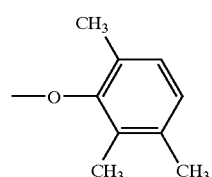 |
| (79) | 2 | CH₃ | H | H | H | H | H | In | 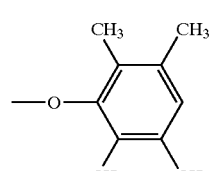 |
| (80) | 2 | CH₃ | H | H | H | H | H | In | 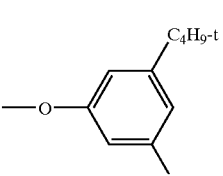 |
TABLE 8
| Compound | n | R₁ | R₂ | R₃ | R₄ | R₅ | R₆ | M | L |
|---|---|---|---|---|---|---|---|---|---|
| (81) | 2 | CH₃ | H | H | H | H | H | In | 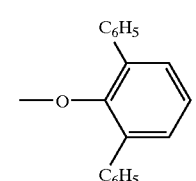 |

TABLE 8-continued
| Compound | n | $R_1$ | $R_2$ | $R_3$ | $R_4$ | $R_5$ | $R_6$ | M | L |
|---|---|---|---|---|---|---|---|---|---|
| (82) | 2 | $CH_3$ | H | H | H | H | H | In | 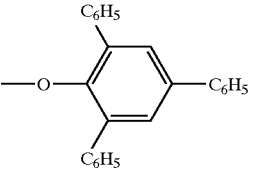 |
| (83) | 2 | $CH_3$ | H | H | H | H | H | In |  |
| (84) | 2 | $CH_3$ | H | H | H | H | H | In | 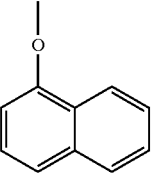 |
| (85) | 2 | $CH_3$ | H | H | H | H | H | In | 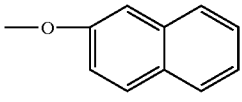 |
| (86) | 2 | $-C_2H_5$ | H | H | H | H | H | In | 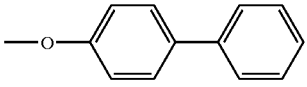 |
| (87) | 2 | $-C_2H_5$ | H | H | H | H | H | In | 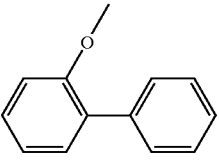 |
| (88) | 2 | $-C_2H_5$ | H | H | H | H | H | In | 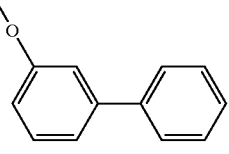 |
| (89) | 2 | $-C_2H_5$ | H | H | H | H | H | In | 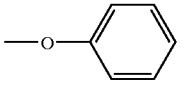 |
| (90) | 2 | $-C_2H_5$ | H | H | H | H | H | In | 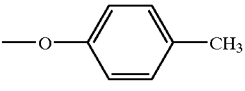 |
| (91) | 2 | $-C_2H_5$ | H | H | H | H | H | In | 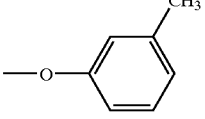 |
| (92) | 2 | $-C_2H_5$ | H | H | H | H | H | In | 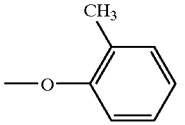 |

TABLE 9
| Compound | n | R₁ | R₂ | R₃ | R₄ | R₅ | R₆ | M | L |
|---|---|---|---|---|---|---|---|---|---|
| (93) | 2 | —C₂H₅ | H | H | H | H | H | In | 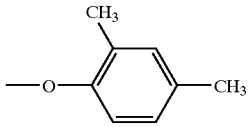 |
| (94) | 2 | —C₂H₅ | H | H | H | H | H | In | 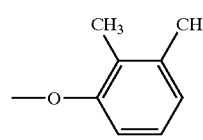 |
| (95) | 2 | —C₂H₅ | H | H | H | H | H | In | 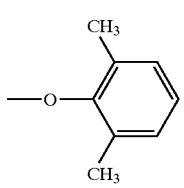 |
| (96) | 2 | —C₂H₅ | H | H | H | H | H | In | 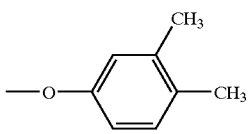 |
| (97) | 2 | —C₂H₅ | H | H | H | H | H | In | 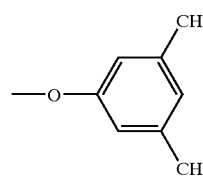 |
| (98) | 2 | —C₂H₅ | H | H | H | H | H | In | 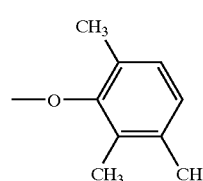 |
| (99) | 2 | —C₂H₅ | H | H | H | H | H | In | 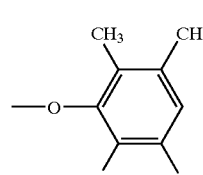 |
| (100) | 2 | —C₂H₅ | H | H | H | H | H | In | 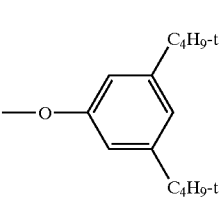 |

TABLE 9-continued
| Compound | n | R₁ | R₂ | R₃ | R₄ | R₅ | R₆ | M | L |
|---|---|---|---|---|---|---|---|---|---|
| (101) | 2 | —C₂H₅ | H | H | H | H | H | In | 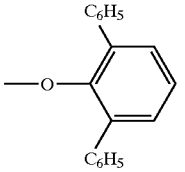 |
TABLE 10
| Compound | n | R₁ | R₂ | R₃ | R₄ | R₅ | R₆ | M | L |
|---|---|---|---|---|---|---|---|---|---|
| (102) | 2 | —C₂H₅ | H | H | H | H | H | In | 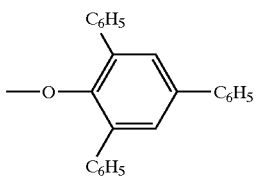 |
| (103) | 2 | —C₂H₅ | H | H | H | H | H | In | 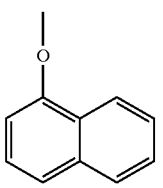 |
| (104) | 2 | —C₂H₅ | H | H | H | H | H | In | 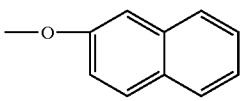 |
| (105) | 2 | H | H | H | Cl | H | Cl | In | 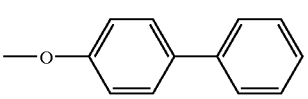 |
| (106) | 2 | H | H | H | Cl | H | Cl | In | 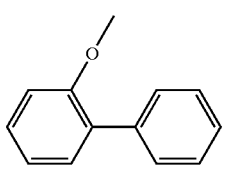 |
| (107) | 2 | H | H | H | Cl | H | Cl | In | 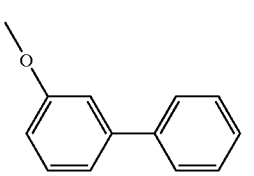 |
| (108) | 2 | H | H | H | Cl | H | Cl | In | 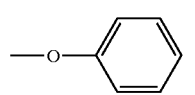 |
| (109) | 2 | H | H | H | Cl | H | Cl | In | 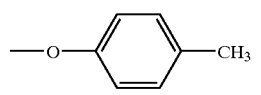 |

TABLE 10-continued
| Compound | n | R₁ | R₂ | R₃ | R₄ | R₅ | R₆ | M | L |
|---|---|---|---|---|---|---|---|---|---|
| (110) | 2 | H | H | H | Cl | H | Cl | In | 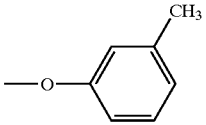 |
| (111) | 2 | H | H | H | Cl | H | Cl | In | 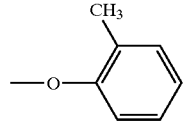 |
| (112) | 2 | H | H | H | Cl | H | Cl | In | 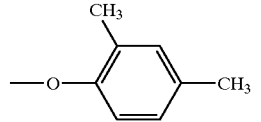 |
| (113) | 2 | H | H | H | Cl | H | Cl | In | 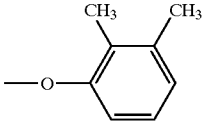 |
TABLE 11
| Compound | n | R₁ | R₂ | R₃ | R₄ | R₅ | R₆ | M | L |
|---|---|---|---|---|---|---|---|---|---|
| (114) | 2 | H | H | H | Cl | H | Cl | In | 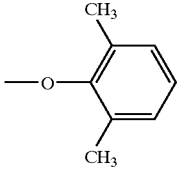 |
| (115) | 2 | H | H | H | Cl | H | Cl | In | 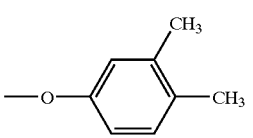 |
| (116) | 2 | H | H | H | Cl | H | Cl | In | 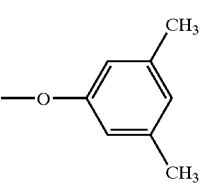 |
| (117) | 2 | H | H | H | Cl | H | Cl | In | 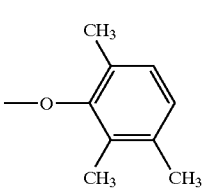 |

TABLE 11-continued
| Compound | n | $R_1$ | $R_2$ | $R_3$ | $R_4$ | $R_5$ | $R_6$ | M | L |
|---|---|---|---|---|---|---|---|---|---|
| (118) | 2 | H | H | H | Cl | H | Cl | In | 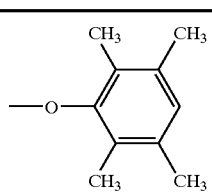 |
| (119) | 2 | H | H | H | Cl | H | Cl | In | 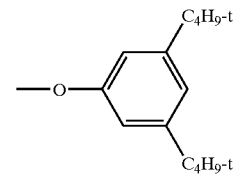 |
| (120) | 2 | H | H | H | Cl | H | Cl | In | 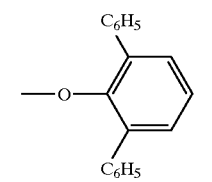 |
| (121) | 2 | H | H | H | Cl | H | Cl | In | 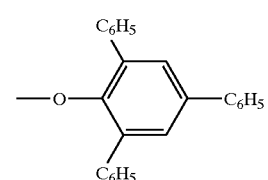 |
| (122) | 2 | H | H | H | Cl | H | Cl | In | 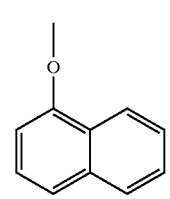 |
TABLE 12
| Compound | n | $R_1$ | $R_2$ | $R_3$ | $R_4$ | $R_5$ | $R_6$ | M | L |
|---|---|---|---|---|---|---|---|---|---|
| (123) | 2 | H | H | H | Cl | H | Cl | In | 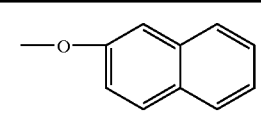 |
| (124) | 2 | $CH_3$ | H | H | H | H | H | Ga | 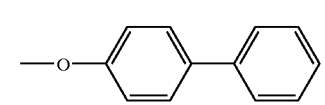 |
| (125) | 2 | $CH_3$ | H | H | H | H | H | Ga | 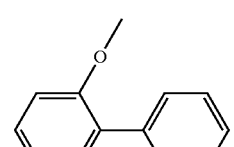 |

TABLE 12-continued
| Compound | n | $R_1$ | $R_2$ | $R_3$ | $R_4$ | $R_5$ | $R_6$ | M | L |
|---|---|---|---|---|---|---|---|---|---|
| (126) | 2 | $CH_3$ | H | H | H | H | H | Ga | 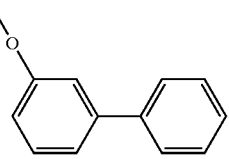 |
| (127) | 2 | $CH_3$ | H | H | H | H | H | Ga | 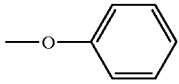 |
| (130) | 2 | $CH_3$ | H | H | H | H | H | Ga | 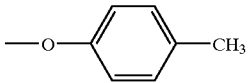 |
| (131) | 2 | $CH_3$ | H | H | H | H | H | Ga | 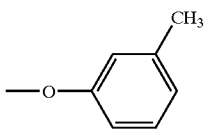 |
| (132) | 2 | $CH_3$ | H | H | H | H | H | Ga | 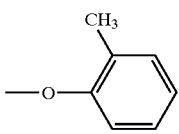 |
| (133) | 2 | $CH_3$ | H | H | H | H | H | Ga | 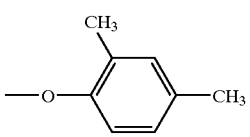 |
| (134) | 2 | $CH_3$ | H | H | H | H | H | Ga | 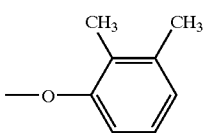 |
| (135) | 2 | $CH_3$ | H | H | H | H | H | Ga | 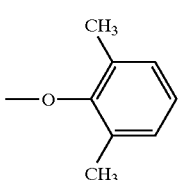 |
| (136) | 2 | $CH_3$ | H | H | H | H | H | Ga | 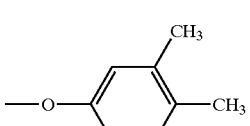 |

TABLE 13
| Compound | n | $R_1$ | $R_2$ | $R_3$ | $R_4$ | $R_5$ | $R_6$ | M | L |
|---|---|---|---|---|---|---|---|---|---|
| (137) | 2 | $CH_3$ | H | H | H | H | H | Ga | 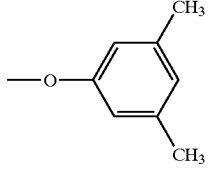 |
| (138) | 2 | $CH_3$ | H | H | H | H | H | Ga | 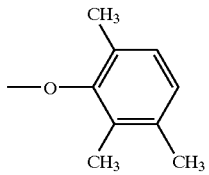 |
| (139) | 2 | $CH_3$ | H | H | H | H | H | Ga | 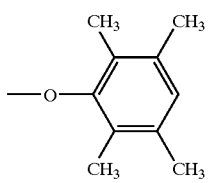 |
| (140) | 2 | $CH_3$ | H | H | H | H | H | Ga | 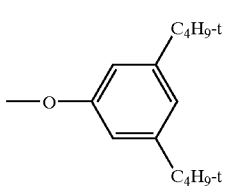 |
| (141) | 2 | $CH_3$ | H | H | H | H | H | Ga | 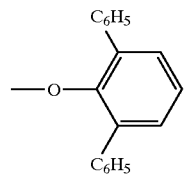 |
| (142) | 2 | $CH_3$ | H | H | H | H | H | Ga | 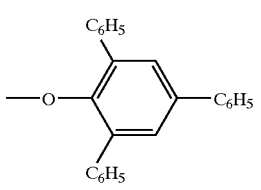 |
| (143) | 2 | $CH_3$ | H | H | H | H | H | Ga |  |
| (144) | 2 | $CH_3$ | H | H | H | H | H | Ga | 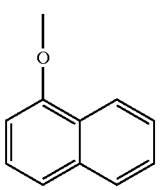 |
| (145) | 2 | $CH_3$ | H | H | H | H | H | Ga | 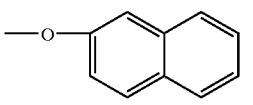 |

TABLE 13-continued
| Compound | n | $R_1$ | $R_2$ | $R_3$ | $R_4$ | $R_5$ | $R_6$ | M | L |
|---|---|---|---|---|---|---|---|---|---|
| (146) | 2 | —$C_2H_5$ | H | H | H | H | H | Ga | 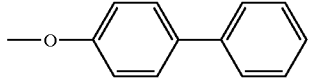 |
TABLE 14
| Compound | n | $R_1$ | $R_2$ | $R_3$ | $R_4$ | $R_5$ | $R_6$ | M | L |
|---|---|---|---|---|---|---|---|---|---|
| (147) | 2 | —$C_2H_5$ | H | H | H | H | H | Ga | 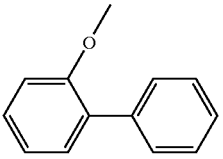 |
| (148) | 2 | —$C_2H_5$ | H | H | H | H | H | Ga | 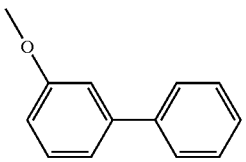 |
| (149) | 2 | —$C_2H_5$ | H | H | H | H | H | Ga | 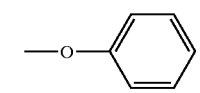 |
| (150) | 2 | —$C_2H_5$ | H | H | H | H | H | Ga | 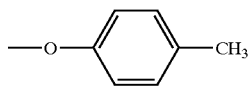 |
| (151) | 2 | —$C_2H_5$ | H | H | H | H | H | Ga | 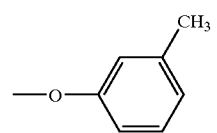 |
| (152) | 2 | —$C_2H_5$ | H | H | H | H | H | Ga | 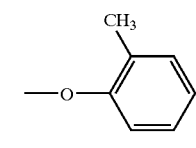 |
| (153) | 2 | —$C_2H_5$ | H | H | H | H | H | Ga | 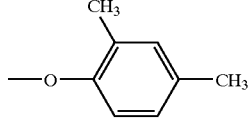 |
| (154) | 2 | —$C_2H_5$ | H | H | H | H | H | Ga | 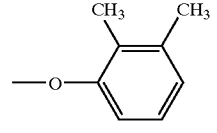 |

TABLE 14-continued
| Compound | n | R₁ | R₂ | R₃ | R₄ | R₅ | R₆ | M | L |
|---|---|---|---|---|---|---|---|---|---|
| (155) | 2 | —C₂H₅ | H | H | H | H | H | Ga | 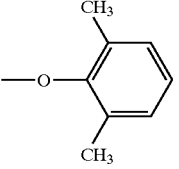 |
| (156) | 2 | —C₂H₅ | H | H | H | H | H | Ga | 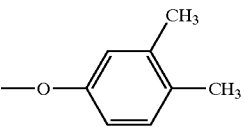 |
| (157) | 2 | —C₂H₅ | H | H | H | H | H | Ga | 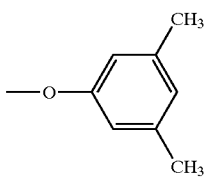 |
| (158) | 2 | —C₂H₅ | H | H | H | H | H | Ga | 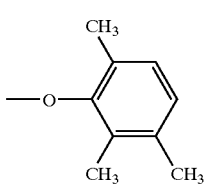 |
TABLE 15
| Compound | n | R₁ | R₂ | R₃ | R₄ | R₅ | R₆ | M | L |
|---|---|---|---|---|---|---|---|---|---|
| (159) | 2 | —C₂H₅ | H | H | H | H | H | Ga | 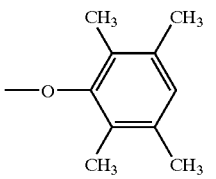 |
| (160) | 2 | —C₂H₅ | H | H | H | H | H | Ga | 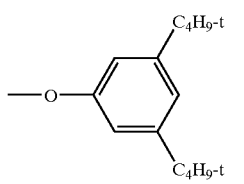 |
| (161) | 2 | —C₂H₅ | H | H | H | H | H | Ga | 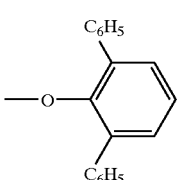 |
| (162) | 2 | —C₂H₅ | H | H | H | H | H | Ga | 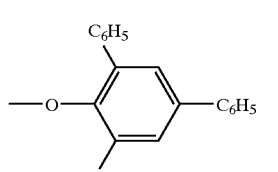 |

TABLE 15-continued
| Compound | n | R₁ | R₂ | R₃ | R₄ | R₅ | R₆ | M | L |
|---|---|---|---|---|---|---|---|---|---|
| (163) | 2 | —C₂H₅ | H | H | H | H | H | Ga | 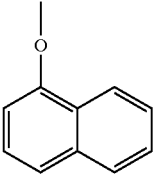 |
| (164) | 2 | —C₂H₅ | H | H | H | H | H | Ga | 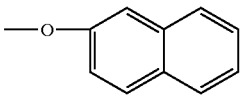 |
| (165) | 2 | H | H | H | Cl | H | Cl | Ga | 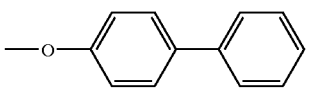 |
| (166) | 2 | H | H | H | Cl | H | Cl | Ga | 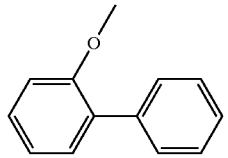 |
| (167) | 2 | H | H | H | Cl | H | Cl | Ga | 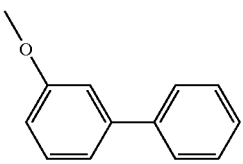 |
| (168) | 2 | H | H | H | Cl | H | Cl | Ga | 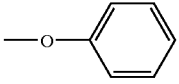 |
| (169) | 2 | H | H | H | Cl | H | Cl | Ga | 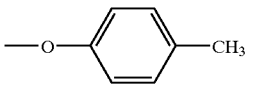 |
| (170) | 2 | H | H | H | Cl | H | Cl | Ga | 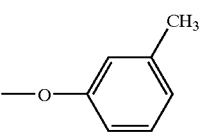 |
TABLE 16
| Compound | n | R₁ | R₂ | R₃ | R₄ | R₅ | R₆ | M | L |
|---|---|---|---|---|---|---|---|---|---|
| (171) | 2 | H | H | H | Cl | H | Cl | Ga | 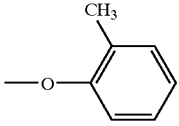 |
| (172) | 2 | H | H | H | Cl | H | Cl | Ga | 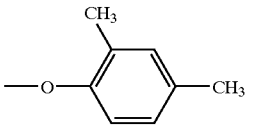 |

TABLE 16-continued
| Compound | n | $R_1$ | $R_2$ | $R_3$ | $R_4$ | $R_5$ | $R_6$ | M | L |
|---|---|---|---|---|---|---|---|---|---|
| (173) | 2 | H | H | H | Cl | H | Cl | Ga | 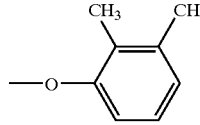 |
| (174) | 2 | H | H | H | Cl | H | Cl | Ga | 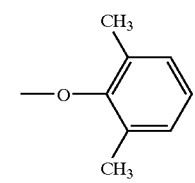 |
| (175) | 2 | H | H | H | Cl | H | Cl | Ga | 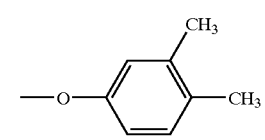 |
| (176) | 2 | H | H | H | Cl | H | Cl | Ga | 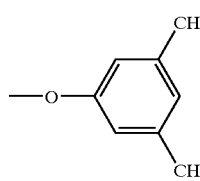 |
| (177) | 2 | H | H | H | Cl | H | Cl | Ga | 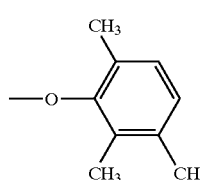 |
| (178) | 2 | H | H | H | Cl | H | Cl | Ga | 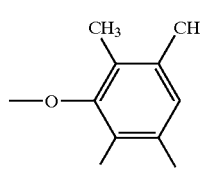 |
| (179) | 2 | H | H | H | Cl | H | Cl | Ga | 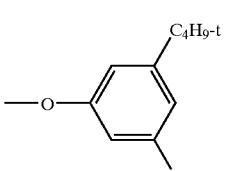 |
| (180) | 2 | H | H | H | Cl | H | Cl | Ga | 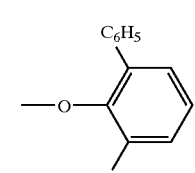 |

TABLE 17

| Compound | n | R₁ | R₂ | R₃ | R₄ | R₅ | R₆ | M | L |
|---|---|---|---|---|---|---|---|---|---|
| (181) | 2 | H | H | H | Cl | H | Cl | Ga | 2,6-diphenyl-4-phenylphenoxy group |
| (182) | 2 | H | H | H | Cl | H | Cl | Ga | 8-methoxynaphthalen-1-yloxy group |
| (183) | 2 | H | H | H | Cl | H | Cl | Ga | 7-methoxynaphthalen-2-yloxy group |
| (184) | 2 | —CH₃ | H | H | H | H | H | Al | 7-methoxy-4-methylcoumarin group |
| (185) | 2 | —CH₃ | H | H | H | H | H | Al | methoxypyrenyl group |
| (186) | 2 | CH₃ | H | H | H | H | H | Ga | (—O—Ga(2-methyl-8-quinolinolato)₂) |
| (187) | 2 | CH₃ | H | H | H | H | H | Al | (—O—Zn—O—Al(8-quinolinolato)₂) |
| (188) | 2 | —CH₃ | H | H | H | H | H | Ga | (—O—Co—O—Ga(8-quinolinolato)₂) |

TABLE 17-continued

| Compound | n | $R_1$ | $R_2$ | $R_3$ | $R_4$ | $R_5$ | $R_6$ | M | L |
|---|---|---|---|---|---|---|---|---|---|
| (189) | 2 | H | H | H | H | H | H | Al | 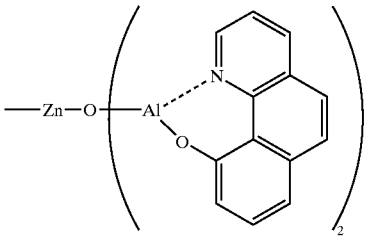 |

TABLE 18

| Compound | n | $R_1$ | $R_2$ | $R_3$ | $R_4$ | $R_5$ | $R_6$ | M | L |
|---|---|---|---|---|---|---|---|---|---|
| (190) | 1 | H | H | H | H | H | H | Zn | 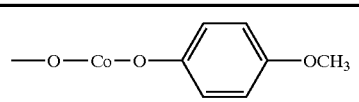 |
| (191) | 1 | H | H | H | H | H | H | Be | 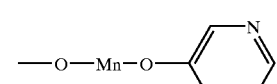 |
| (192) | 1 | H | H | H | H | H | H | Be | 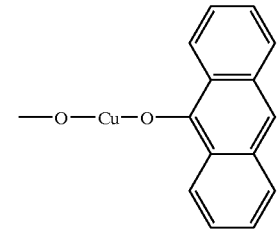 |
| (193) | 1 | H | H | H | H | H | H | Be | 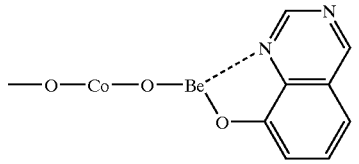 |
| (194) | 1 | H | H | H | H | H | H | Be | 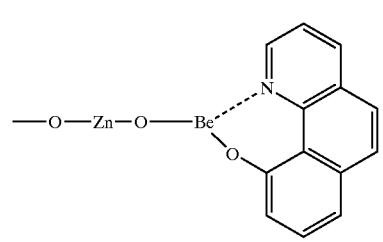 |

Examples of the essential device structure applicable to the organic thin-film EL device having the cathode of the present invention include:

(1) anode/single or multiple hole injection and transport layer/single or multiple emitter layer/cathode,
(2) anode/single or multiple emitter layer/single or multiple electron injection transport layer/cathode and
(3) anode/single or multiple hole injection and transport layer/single or multiple emitter layer/single or multiple electron injection transport layer/cathode. A protective layer or interface layer may be inserted between the cathode and anode as needed. Or, to the organic thin-film EL device of the present invention, a lens-like structure as described in Japanese Patent Application Laid-Open No. 171892/1997 may be applied with a view to lowering the power consumption and increasing the luminous efficiency.

The above-described cathode or cathode protective layer may be formed by the resistance-heating system vacuum deposition method or by sputtering a substance to be deposited by using an inert gas ion as shown in Japanese Patent Application Laid-Open No. 19993/1992 with a view to improving the adhesion. In the above-described film formation method of a cathode or cathode protective layer by sputtering, surface migration is large owing to the use of ions having a kinetic energy not less than several eV for the film formation, which makes it possible to form a film having excellent adhesion with an organic thin-film layer. By the selection of appropriate film forming conditions, physical or chemical damages to an organic thin film layer can be reduced and a cathode and cathode protective layer having much more improved adhesion when compared with the conventional ones can be formed. Even if a mixture of metals, the vapor pressure of each of which differs greatly from each other, is used as a target, a difference of the composition between the target and cathode or target and cathode protective layer is not large. Electrodes can be formed uniformly even on a large substrate so that the present invention is of practical utility. The present invention will hereinafter be described more specifically, but it should however be born in mind that the present invention is not limited to or by the examples.

EXAMPLE 1A

FIG. 1 is a schematic cross-sectional view illustrating the structure of an organic thin-film EL device according to a first embodiment of the present invention, wherein an organic thin film contiguous to a cathode 17 is an emitter layer 15. Example 1A of the present invention will next be described with reference to FIG. 1.

On a glass substrate 11, a film of ITO (indium tin oxide) was formed by the ion plating method. The film was etched into short strips, whereby the glass substrate with an anode 12 was formed. The anode 12 made of ITO had a sheet resistance of 13 Ω/□.

Organic thin films over the ITO-adhered glass substrate were all formed by the molecular-beam deposition method and the vacuum degree during film formation was set at $2 \times 10^{-8}$ Torr or less. At an evaporation rate of 0.05 nm/s, a hole injection layer 13 made of tris(4-(4'-(N,N-di(4-tolyl)amino)styryl) phenyltriphenylamine) (which will hereinafter be abbreviated as "TTPA") of the following formula:

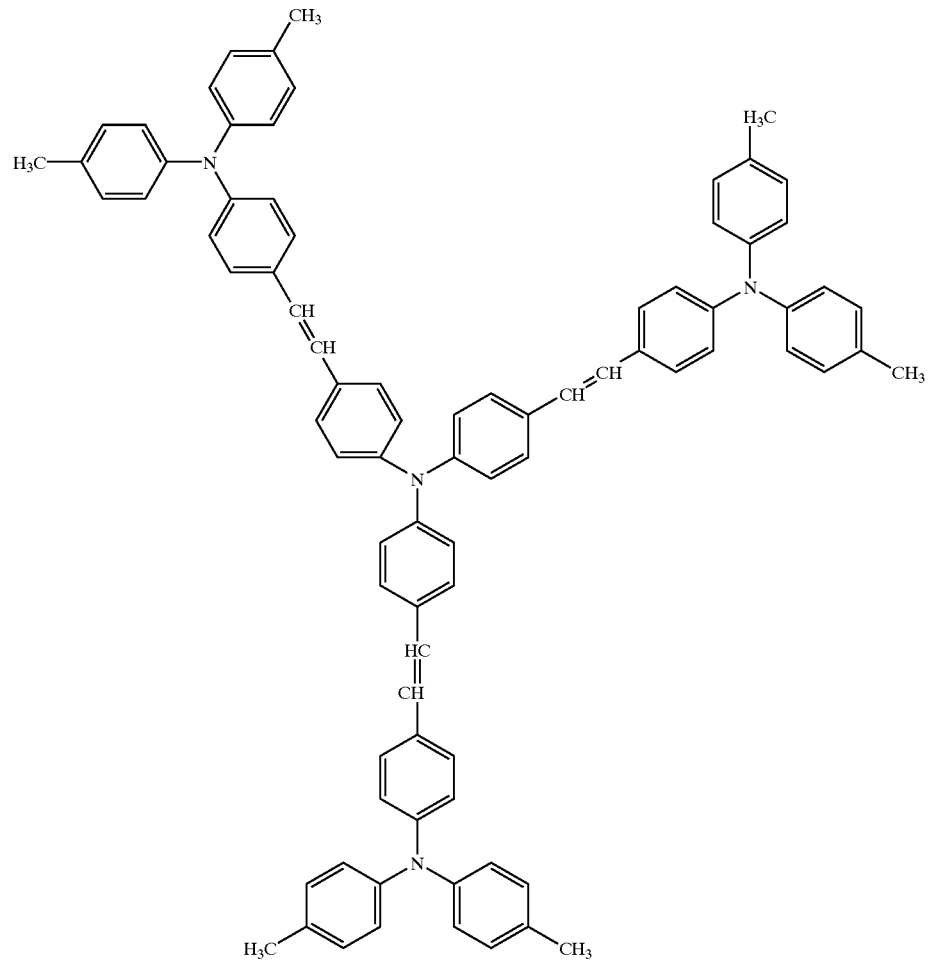

TTPA was formed to a thickness of 35 nm, followed by the formation of a hole transport layer 14 made of N,N'-diphenyl-N,N'-bis(α-naphthyl)-1,1'-biphenyl-4,4'-diamine (which will hereinafter be abbreviated as "α-NPD") of the following formula:

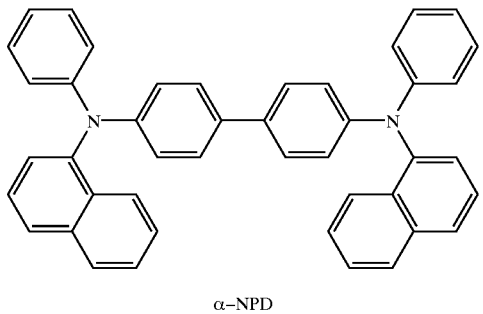

α-NPD was formed to a thickness of 25 nm at an evaporation rate of 0.25 nm/s.

Over the hole transport layer, an emitter layer 15 was formed by the co-deposition method, that is, by evaporating Compound (1) in Table 1 and diphenyl 3,9-perylenedicarboxylate from different deposition sources, respectively. At that time, the evaporation rate was precisely controlled so that the diphenyl 3,9-perylenedicarboxylate was contained in the emitter layer in an amount of 3 mole %, whereby the emitter layer 15 having a thickness of 70 nm was formed.

Over the emitter layer, a cathode 17 made of an aluminum-lithium alloy was pattern formed at a thickness of 150 nm by the co-deposition method, more specifically, by evaporating aluminum and lithium from different evaporation sources respectively.

Lastly, the device was sealed in an Ar gas atmosphere. Incidentally, the concentration of lithium in the cathode 17 employed in this example was determined by the inductively coupled plasma emission spectrometry (ICP-AES).

The organic thin film EL device was electrified and luminous efficiency and lifetime properties (luminance half-life) were evaluated. The luminous efficiency (cd/A) was found from a current density at the time when luminance of 300 $cd/m^2$ was emitted. Lifetime properties were evaluated by causing the light emission of the device by the pulse operation at a pulse frequency of 100 Hz, duty ratio of 50% and peak current density of 10 $mA/cm^2$. While the pulse was off, reverse bias voltage of −10 V was applied.

Figure 5:
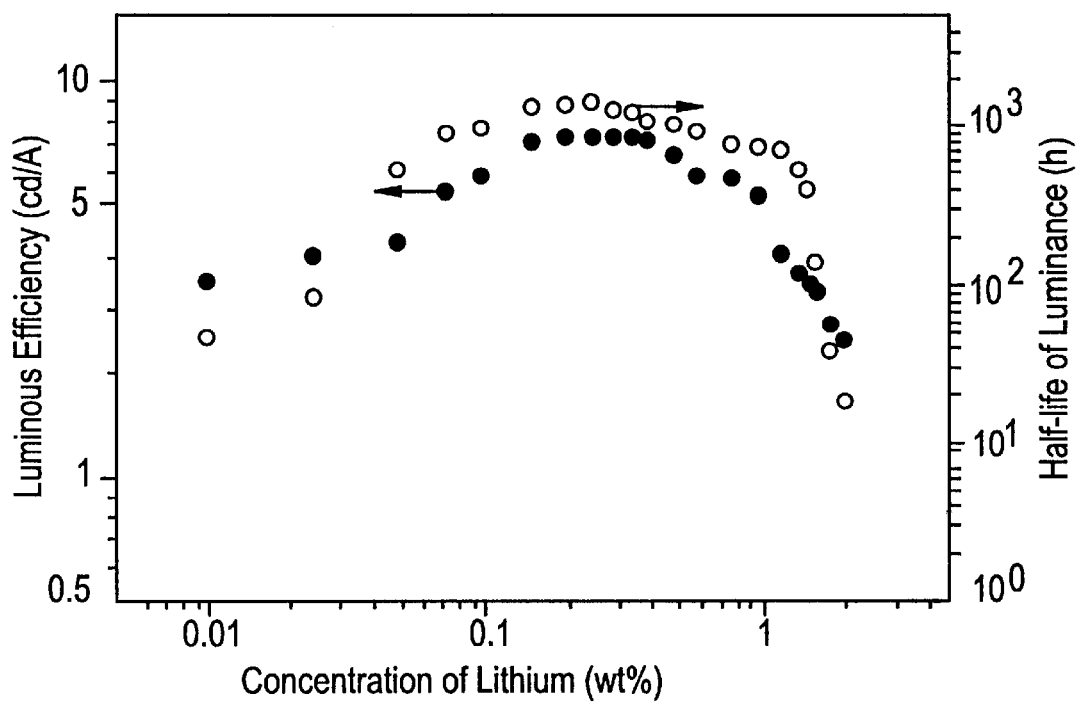
FIG. 5 is a graph illustrating luminous efficiency and luminance half-life of the cathode of Example 1A as a function of its lithium concentration.

FIG. 5 is a graph illustrating the luminous efficiency (●) and luminance half-life (○) of the cathode 17 as a function of its lithium concentration. The luminous efficiency varies with the lithium concentration of the cathode 17 and becomes 3.1 to 7.2 cd/A at a concentration range of 0.05 to 1.5 wt. %. Particularly within a concentration range of 0.15 to 0.5 wt. %, the luminous efficiency shows a stable value of about 7 cd/A. The luminance half-life exceeds 500 hours within a concentration range of 0.05 to 1.5 wt. % and above all, it exceeds 1000 hours at a concentration range of 0.1 to 0.5 wt. %. At a concentration range less than 0.05 wt. % or greater than 1.5 wt. %, not only a small luminous efficiency but also a markedly short luminance half-life is observed.

The adhesion of the cathode 17 was measured by peeling in the crosshatching test. The cathode 17 having a lithium concentration of 0.05 to 1.5 wt. % showed the highest load of 1500 to 1800 gf/24 mm, while that having a lithium concentration less than 0.05 wt. % showed the load of 550 gf/24 mm or less and that having a lithium concentration greater than 1.5 wt. % showed the load of 850 gf/24 mm or less.

In this example, when the aluminum alloy cathode 17 having a lithium concentration of 0.05 to 1.5 wt. %, good properties were attained and particularly at a lithium concentration of 0.15 to 0.5 wt. %, efficiency was high and lifetime properties were stable. This result suggests that an organic thin-film EL device having excellent properties can be obtained by incorporating Compound (1) in the thin-film emitter layer 15 contiguous to the aluminum-lithium cathode 17 and setting the lithium concentration in the cathode 17 at a range of 0.05 to 1.5 wt. %, preferably 0.10 to 0.5 wt. %, more preferably 0.15 to 0.5 wt. %.

EXAMPLES 2A to 42A

In each of Examples 2A to 42A, except that the emitter layer 15 having a thickness of 70 nm was formed by a co-deposition method in which each of the compounds shown in Table 19 and 20 instead of Compound (1), as the compound of the formula (I) and diphenyl 3,9-perylenedicarboxylate were evaporated from different deposition sources, respectively, wherein the evaporation rate was precisely controlled so that the diphenyl 3,9-perylenedicarboxylate was contained in the emitter layer 15 in an amount of 3 mole %, an organic thin-film EL device was formed in a similar manner to Example 1A, and its properties were evaluated. Results are shown in Tables 19 and 20.

Even if any one of the above-described compounds were used for the emitter layer 15, when the aluminum-lithium alloy cathode 17 had a lithium concentration ranging from 0.05 to 1.5 wt. %, luminous efficiency became about twice and luminance half-life became about three to five times when compared with those at a lithium concentration less than 0.05 wt. % or greater than 1.5 wt. %. The lithium concentration which is regarded as most suited in Comparative Example 1A is as small as 0.01 to 0.1 wt. % and its range is very narrow, while in this example, the most suited lithium concentration is as wide as 0.05 to 1.5 wt. % and good light-emitting properties are attained. This suggests that when the compound represented by the formula (I) is used for the emitter layer 15 contiguous to the cathode 17, excellent advantages can be obtained at a lithium concentration adjusted to 0.05 to 1.5 wt. %.

The adhesion of the cathode portion 17 was measured by peeling in the crosshatching test. The cathode 17 having a lithium concentration of 0.05 to 1.5 wt. % showed the highest load of 1200 to 1800 gf/24 mm, while that having a lithium concentration less than 0.05 wt. % showed the load of 550 gf/24 mm or less and that having a lithium concentration greater than 1.5 wt. % showed the load of 850 gf/24 mm or less.

The above results indicate that when the compound of the formula (I) is used for the emitter layer 15 contiguous to the cathode 17, improved adhesion, high efficiency and long-life light emission can be attained by adjusting the lithium concentration in the aluminum-lithium alloy cathode 17 at 0.05 to 1.5 wt. %.

Comparative Example 1A

Except that the emitter layer 15 having a thickness of 70 nm was formed by a co-deposition method in which conventionally and ordinarily used Alq and diphenyl 3,9-perylenedicarboxylate were evaporated from different deposition sources, respectively, wherein the evaporation rate was precisely controlled so that the diphenyl 3,9-perylenedicarboxylate was contained in the emitter layer 15 in an amount of 3 mole %, an organic thin-film EL device was formed in a similar manner to Example 1A, and its properties were evaluated.

Figure 9:
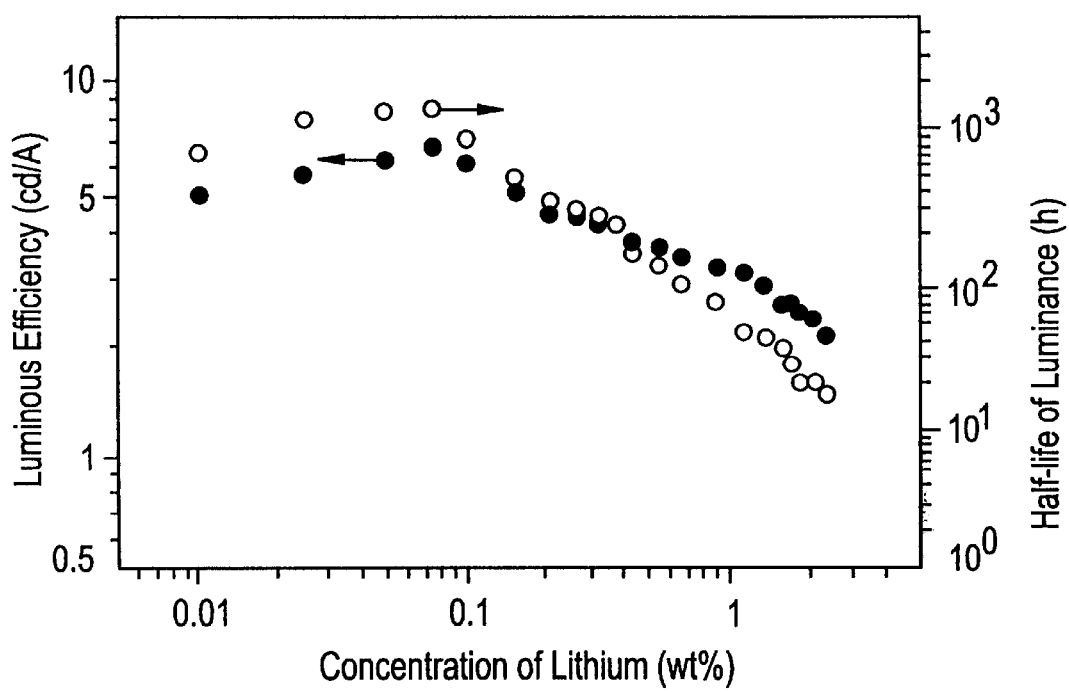
FIG. 9 is a graph illustrating luminous efficiency and luminance half-life of the cathode of Comparative Example 1A as a function of its lithium concentration.

As a result, it was observed, as illustrated in FIG. 9, that luminous efficiency and lifetime properties each showed a peak between the lithium concentration of 0.01 and 0.1 wt. %. At the lithium concentration exceeding 0.1 wt. %, a drastic deterioration in light-emitting properties was observed.

When the adhesion of the cathode portion was measured by peeling in the crosshatching test. As a result, the load was 1000 to 1200 gf/24 mm and showed the highest value when the cathode 17 having a lithium concentration of 0.01 to 0.1 wt. % was employed, while it was 900 gf/24 mm or less when the cathode 17 having a lithium concentration exceeding 0.1 wt. % was employed.

EXAMPLE 43A

Figure 2:
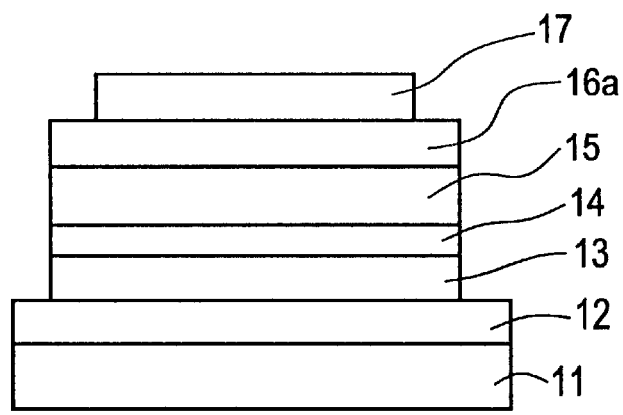
FIG. 2 is a schematic cross-sectional view illustrating an organic thin-film EL device of the present invention wherein an organic thin-film layer adjacent to a cathode is an electron injection transport layer.

FIG. 2 is a schematic cross-sectional view illustrating the structure of an organic thin-film EL device according to the second embodiment of the present invention, wherein an organic thin film contiguous to a cathode 17 is an electron injection transport layer 16a and the functions of an emitter layer 15 and electron transport layer 16a are essentially separated.

Example 43A of the present invention will next be described with reference to FIG. 2. On a glass substrate 11, an ITO (indium tin oxide) film was formed by the ion plating method, followed by etching into short strips, whereby a glass substrate with an anode 12 was formed. The anode 12 made of ITO had a sheet resistance of 13 Ω/□. Organic thin films over the ITO-applied glass substrate were all formed by the molecular-beam deposition method and the vacuum degree during the film formation was set at $2 \times 10^{-8}$ Torr or less.

A hole injection layer 13 made of TTPA was then formed to a thickness of 35 nm at an evaporation rate of 0.05 nm/s, followed by the formation of a hole transport layer 14 made of α-NPD to a thickness of 15 nm at an evaporation rate of 0.25 nm/s.

Over the hole transport layer, an emitter layer 15 made of 9,10-bis(4-(4-(N,N-di(4-tolyl)aminophenyl)benzyliden) anthracene (which will hereinafter be abbreviated as "BPBA") represented by the following formula:

Then, a cathode 17 made of an aluminum-lithium alloy was pattern-formed to a thickness of 150 nm over the electron injection transport layer by the co-deposition method in which aluminum and lithium were evaporated from different evaporation sources respectively.

Finally, the resulting device was sealed in an Ar gas atmosphere. In Example 43A, the concentration of lithium in the cathode 17 was determined by ICP-AES.

The organic thin-film EL device so formed was electrified and luminous efficiency and lifetime properties (luminance half-life) were evaluated. The luminous efficiency (cd/A) was found from a current density at the time when luminance of 300 cd/m² was emitted. Lifetime properties were evaluated by causing the light emission of the device by the pulse operation at a pulse frequency of 100 Hz, duty ratio of 50% and peak current density of 10 mA/cm². While the pulse was off, reverse bias voltage of −10 V was applied.

Figure 6:
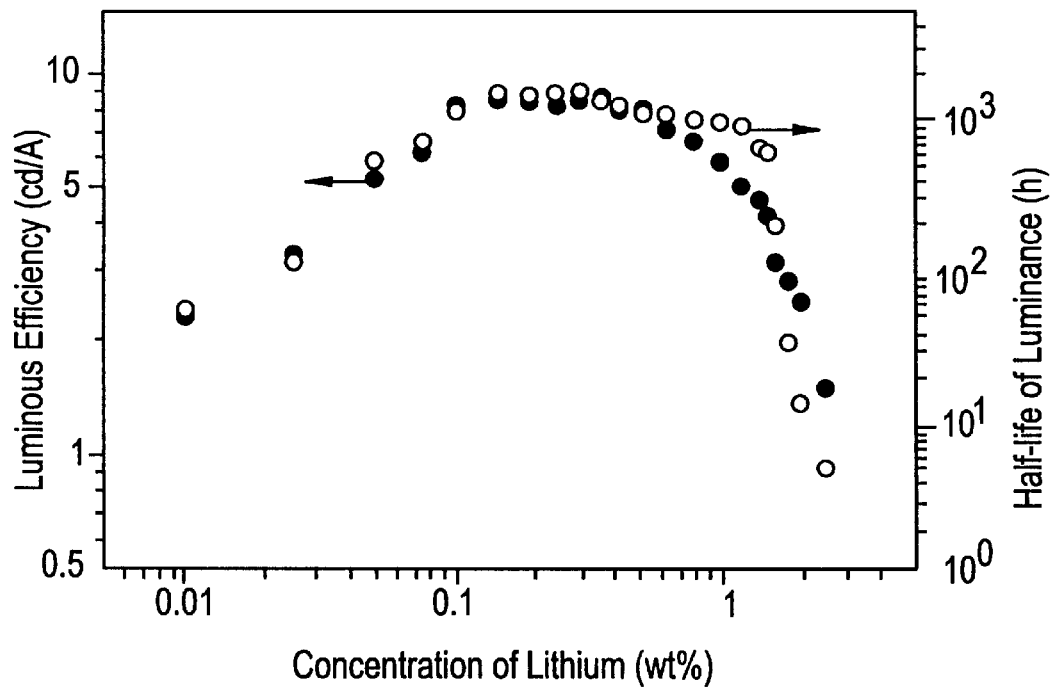
FIG. 6 is a graph illustrating luminous efficiency and luminance half-life of the cathode of Example 43A as a function of its lithium concentration.

FIG. 6 is a graph illustrating the luminous efficiency (●) and luminance half-life (○) of the cathode 17 as a function of its lithium concentration. The luminous efficiency varies with the lithium concentration of the cathode 17 and becomes 4.3 to 8.5 cd/A at a concentration range of 0.05 to 1.5 wt. %. Particularly within a concentration range of 0.1 to 0.5 wt. %, the luminous efficiency is as high as 8 cd/A or greater. The luminance half-life exceeds 500 hours within a concentration range of 0.05 to 1.5 wt. % and above all, it exceeds 1000 hours at a concentration range of 0.1 to 0.5 wt. %. At a concentration outside the above range, that is, a range less than 0.05 wt. % or greater than 1.5 wt. %, not only a small luminous efficiency but also a markedly short luminance half-life as short as 100 hours or less are observed. Such a lithium concentration outside the above range cannot be employed practically.

The adhesion of the cathode portion 17 was measured by peeling in the crosshatching test. The cathode 17 having a lithium concentration ranging from 0.05 to 1.5 wt. % showed the highest load of 1500 to 1800 gf/24 mm, while that having a lithium concentration less than 0.05 wt. % showed the load of 550 gf/24 mm or less and that having a lithium concentration greater than 1.5 wt. % showed the load of 850 gf/24 mm or less.

In this Example 43A, when the aluminum alloy cathode 17 having a lithium concentration of 0.05 to 1.5 wt. %, good

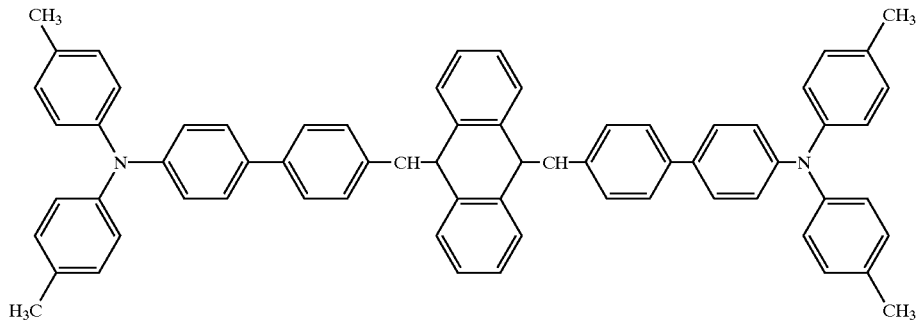

BPBA was formed to a thickness of 48 nm at an evaporation rate of 0.07 nm/s.

Over the emitter layer 15, an electron injection transport layer 16a made of the compound (1) in Table 1 as formed to a thickness of 35 nm at an evaporation rate of 0.2 nm/s.

properties were attained and particularly at a lithium concentration of 0.1 to 0.5 wt. %, efficiency was high and lifetime properties were stable. This result suggests that, with respect to organic thin-film EL devices having the device structure shown in FIG. 2, an organic thin-film EL device having excellent properties can be obtained by incorporating Compound (1) of Table 1 in the electron injection transport layer 16a contiguous to the cathode 17 made of an aluminum-lithium alloy and setting the lithium concentration in the cathode 17 at a range of 0.65 to 1.5 wt. %, preferably 0.1 to 0.5 wt. %.

EXAMPLES 44A to 84A

In each of Examples 44A to 84A, in a similar manner to Example 43A except that each of the compounds shown in Tables 21 and 22 was used as the compound of the formula (I) for forming the electron injection transport layer 16a of FIG. 2, an organic thin-film EL device was formed and its properties were evaluated. Results are shown in Tables 21 and 22.

Even if any one of the above-described compounds were employed as the hole injection transport layer 16a, when the aluminum-lithium alloy cathode 17 had a lithium concentration ranging from 0.05 to 1.5 wt. %, luminous efficiency became about twice and luminance half-life became about three to five times when compared with those at a lithium concentration less than 0.05 wt. % or greater than 1.5 wt. %. The lithium concentration which is regarded as most suited in Comparative Example 2A is as small as 0.01 to 0.1 wt. % and its range is very narrow, while in this example, the most suited lithium concentration is as wide as 0.05 to 1.5 wt. % and good light-emitting properties are attained. This suggests that when the compound represented by the formula (I) is used for an electron injection transport layer 16a contiguous to the cathode 17, excellent advantages can be obtained at a lithium concentration adjusted to 0.05 to 1.5 wt. %.

The adhesion of the cathode portion 17 was measured by peeling in the crosshatching test. The cathode 17 having a lithium concentration of 0.05 to 1.5 wt. % showed the highest load of 1200 to 1800 gf/24 mm, while that having a lithium concentration less than 0.05 wt. % showed the load of 550 gf/24 mm or less and that having a lithium concentration greater than 1.5 wt. % showed the load of 850 gf/24 mm or less.

The above results suggest that when the compound of the formula (I) is used for the electron injection. transport layer 16a contiguous to the cathode 17, improved adhesion, high efficiency and long-life light emission can be attained by adjusting the lithium concentration in the cathode 17 made of an aluminum-lithium alloy at 0.05 to 1.5 wt. %.

Comparative Example 2A

Figure 10:
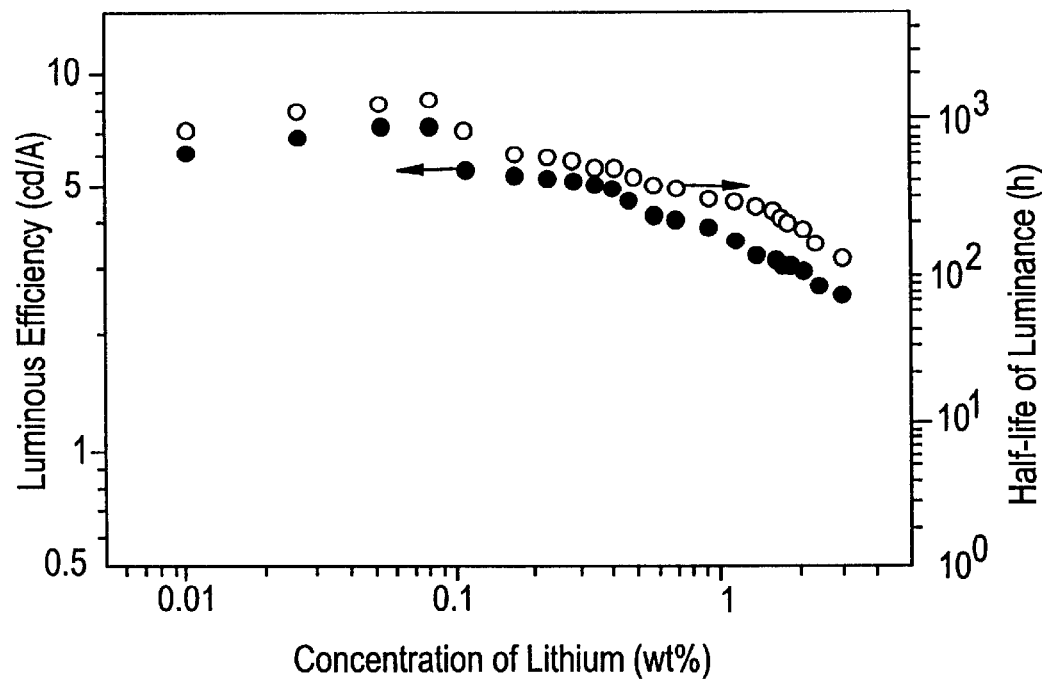
FIG. 10 is a graph illustrating luminous efficiency and luminance half-life of the cathode of Comparative Example 2A as a function of its lithium concentration.

In a similar manner to Example 43A except that conventionally and ordinarily used Alq was used for forming an electron injection transport layer 16a, an organic thin-film EL device was formed and its properties were evaluated. As a result, it was observed, as illustrated in FIG. 10, that luminous efficiency and lifetime properties each showed a peak between the lithium concentration of 0.01 and 0.1 wt. %. At the lithium concentration exceeding 0.1 wt. %, a drastic deterioration in light emitting properties was observed.

The adhesion of the cathode portion 17 was measured by peeling in the crosshatching test. As a result, the load was 1000 to 1200 gf/24 mm and showed the highest value when the cathode 17 having a lithium concentration of 0.01 to 0.1 wt. % was employed, while it was 900 gf/24 mm when the cathode 17 having a lithium concentration exceeding 0.1 wt. % was employed.

EXAMPLE 85A

Figure 3:
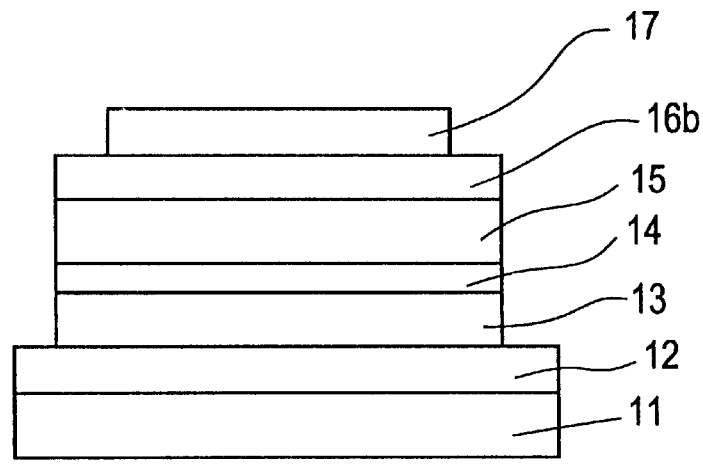
FIG. 3 is a schematic cross-sectional view illustrating an organic thin-film EL device of the present invention wherein an organic thin-film layer adjacent to a cathode is an electron injection transport layer containing at least one of the cathode components.

FIG. 3 is a schematic cross-sectional view illustrating the structure of an organic thin-film EL device according to a third embodiment of the present invention, which is different from the structure of the second embodiment in that at least one of the cathode components is contained in the electron injection transport layer 16b contiguous to the cathode 17.

Example 85A of the present invention will next be described with reference to FIG. 3. On a glass substrate 11, an ITO (indium tin oxide) film was formed by the ion plating method, followed by etching into short strips, whereby a glass substrate with an anode 12 was formed. The anode 12 made of ITO had a sheet resistance of 13 Ω/□. Organic thin films over the ITO-applied glass substrate were all formed by the molecular-beam deposition method and the vacuum degree during film formation was set at $2 \times 10^{-8}$ Torr or less.

A hole injection layer 13 made of TTPA was then formed to a thickness of 35 nm at an evaporation rate of 4 0.05 nm/s, followed by the formation of a hole transport layer 14 made of α-NPD to a thickness of 25 nm at an evaporation rate of 0.25 nm/s.

Over the hole transport layer, an emitter layer 15 made of BPBA was formed to a thickness of 48 nm at an evaporation rate of 0.07 nm/s. Over the emitter layer 15, an electron injection transport layer 16b containing 1.5 wt. % of lithium was formed to a thickness of 35 nm by the co-deposition method in which lithium and the compound (1) were evaporated as electron transport materials from different evaporation sources, respectively.

Then, a cathode 17 made of an aluminum-lithium alloy was pattern-formed to a thickness of 150 nm over the electron injection transport layer by the co-deposition method in which aluminum and lithium were evaporated from different evaporation sources respectively.

Finally, the resulting element was sealed in an Ar gas atmosphere. In Example 85A, the concentration of lithium in the cathode 17 was studied and determined by ICP-AES.

Figure 7:
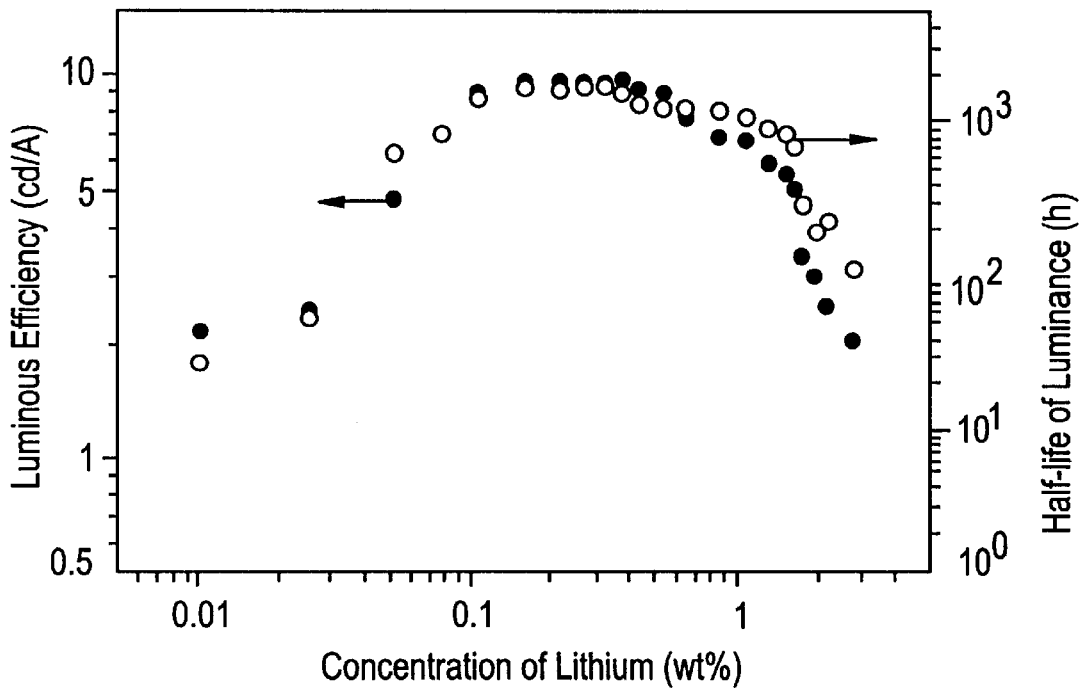
FIG. 7 is a graph illustrating luminous efficiency and luminance half-life of the cathode of Example 85A as a function of its lithium concentration.

FIG. 7 is a graph illustrating the luminous efficiency (●) and luminance half-life (○) of the cathode 17 as a function of its lithium concentration. The luminous efficiency varies with the lithium concentration of the cathode 17 and becomes 5 to 9.5 cd/A at a concentration range of 0.05 to 1.5 wt. %. Particularly within a concentration range of 0.1 to 0.5 wt. %, the luminous efficiency is as high as 9 cd/A or greater. The luminance half-life exceeds 600 hours within a concentration range of 0.05 to 1.5 wt. % and above all, it exceeds 1000 hours at a concentration range of 0.1 to 0.5 wt. %. At a concentration outside the above range, that is, a range less than 0.05 wt. % or greater than 1.5 wt. %, on the other hand, not only luminous efficiency but also luminance half-life decreases to half or less of that within the above-described concentration range and luminance half-life becomes even 300 hours or less. In addition, in this Example 85A, the luminous efficiency and lifetime properties shows about a 10% improvement when compared with those of Example 43A. Such an improvement in the properties was brought about by doping lithium, which is one of the cathode components, into the electron injection transport layer 16b of the organic thin-film EL device of the present invention.

The adhesion of the cathode portion 17 was measured by peeling in the crosshatching test. The cathode 17 having a lithium concentration of 0.05 to 1.5 wt. % showed the highest load of 1800 to 2200 gf/24 mm, while that having a lithium concentration less than 0.05 wt. % showed the load of 1000 gf/24 mm and that having a lithium concentration greater than 1.5 wt. % showed the load of 1200 gf/24 mm. When compared with Example 43A, the adhesion was improved by about 1.3 times. Such an improvement in the properties was brought about by doping lithium, which is one of the cathode components, into the electron injection transport layer 16b of the present invention, thereby improving the adhesion.

In this Example, when the aluminum cathode 17 had a lithium concentration of 0.05 to 1.5 wt. %, properties were good and particularly at a lithium concentration of 0.1 to 0.5 wt. %, luminous efficiency was high and lifetime properties were stable. This result suggests that, with respect to organic thin-film EL devices having the device structure shown in FIG. 3, an organic thin-film EL device having excellent properties can be obtained by incorporating the compound (1) in the electron injection transport layer 16b contiguous to the cathode 17 made of an aluminum and lithium alloy and setting the lithium concentration in the cathode 17 at a range of 0.05 to 1.5 wt. %, preferably 0.1 to 0.5 wt. %.

EXAMPLES 86A to 105A

In each of Examples 86A to 105A, in a similar manner to Example 85A except that each of the compounds shown in Tables 23 was used for the electron injection transport layer 16b of FIG. 3, an organic thin-film EL device was formed and its properties were evaluated. The results are shown in Tables 23.

Even if any one of the above-described compounds were used for the electron injection transport layer 16b, when the aluminum-lithium alloy cathode 17 had a lithium concentration ranging from 0.05 to 1.5 wt. %, luminous efficiency became about twice and luminance half-life became about three to five times when compared with those at a lithium concentration less than 0.05 wt. % or greater than 1.5 wt. %. The lithium concentration which is regarded as most suited in Comparative Example 3A is as small as 0.01 to 0.1 wt. % and its range is very narrow, while in this example, the most suited lithium concentration is as wide as 0.05 to 1.5 wt. % and good light-emitting properties are attained. This suggests that when the compound represented by the formula (I) is used for the electron injection transport layer 16b contiguous to the cathode, excellent advantages can be obtained at a lithium concentration adjusted to 0.05 to 1.5 wt. %.

The adhesion of the cathode portion 17 was measured by peeling in the crosshatching test. The cathode 17 having a lithium concentration of 0.05 to 1.5 wt. % showed the highest load of 1800 to 2200 gf/24 mm, while that having a lithium concentration less than 0.05 wt. % showed the load of 550 gf/24 mm or less and that having a lithium concentration greater than 1.5 wt. % showed the load of 850 gf/24 mm or less.

The above results suggest that when the compound of the formula (I) is used for the electron injection transport layer 16b contiguous to the cathode 17, improved adhesion, high efficiency and long-life light emission can be attained by adjusting the lithium concentration in the cathode 17 made of an aluminum-lithium alloy at 0.05 to 1.5 wt. %.

Comparative Example 3A

Figure 11:
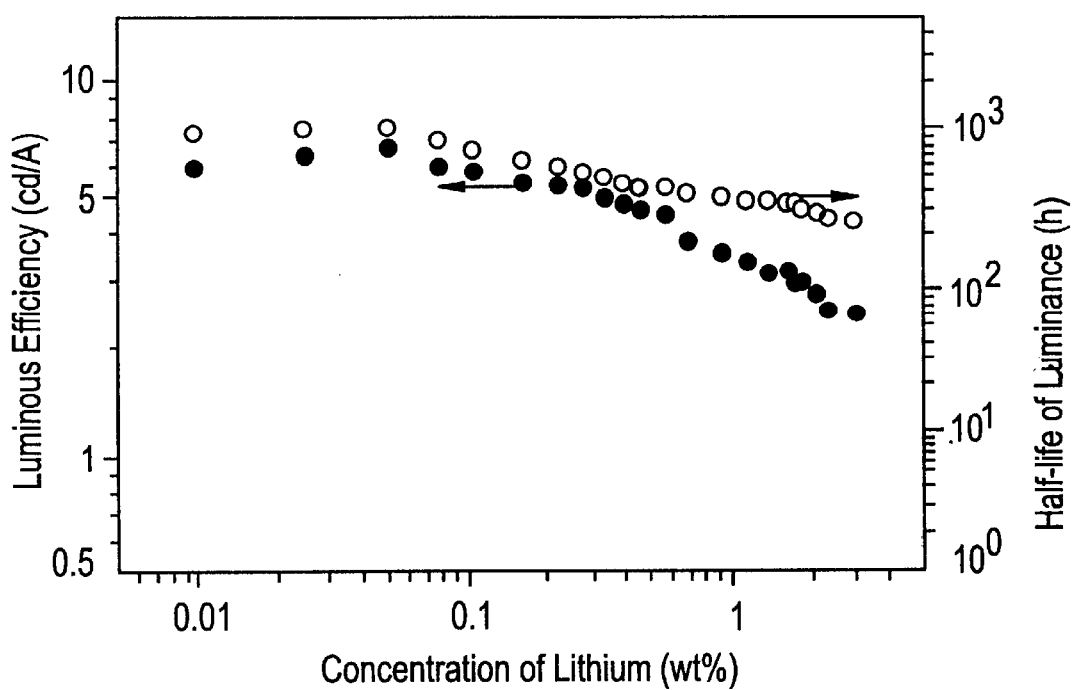
FIG. 11 is a graph illustrating luminous efficiency and luminance half-life of the cathode of Comparative Example 3A as a function of its lithium concentration.

In a similar manner to Example 85A except that the electron injection transport layer 16b was formed by doping lithium into a layer composed of conventionally and ordinarily used Alq, an organic thin-film EL device was formed and its properties were evaluated. As a result, it was observed, as illustrated in FIG. 11, that luminous efficiency and lifetime properties each showed a peak within the lithium concentration ranging from 0.01 to 0.1 wt. %. At the lithium concentration exceeding 0.1 wt. %, a drastic deterioration in light emitting properties was observed.

The adhesion of the cathode portion 17 was measured by peeling in the crosshatching test. As a result, the load was 1000 to 1200 gf/24 mm and showed the highest value when the cathode 17 having a lithium concentration of 0.01 to 0.1 wt. % was employed, while it was 900 gf/24 mm or less when the cathode 17 having a lithium concentration exceeding 0.1 wt. % was employed.

EXAMPLE 106A

Figure 4:
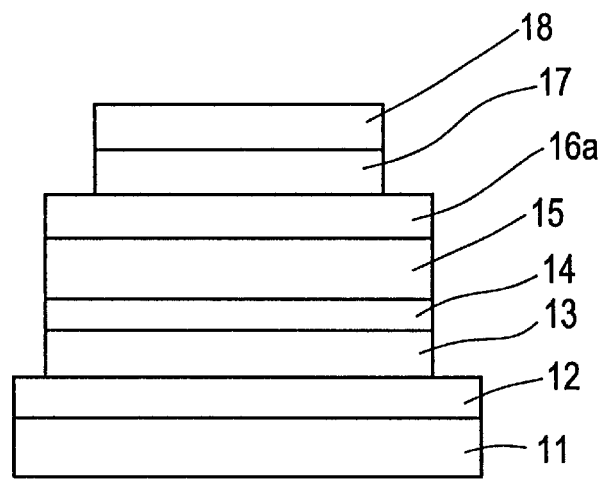
FIG. 4 is a schematic cross-sectional view of an organic thin-film EL device of the present invention having a cathode protective layer formed on a cathode.

FIG. 4 is a schematic cross-sectional view illustrating the structure of an organic thin-film EL device according to a fourth embodiment of the present invention, which is different from the structures of the other embodiments in that a cathode protective layer 18 is disposed over a cathode 17.

Example 106A of the present invention will next be described with reference to FIG. 4. On a glass substrate 11, an ITO (indium tin oxide) film was formed by the ion plating method, followed by etching into short strips, whereby a glass substrate with an anode 12 was formed.

The anode 12 made of ITO had a sheet resistance of 13 $\Omega/\square$. Organic thin films over the ITO-applied glass substrate were all formed by the molecular-beam deposition method and the vacuum degree during the film formation was set at $2 \times 10^{-8}$ Torr or less.

A hole injection layer 13 made of TTPA was then formed to a thickness of 35 nm at an evaporation rate of 0.05 nm/s, followed by the formation of a hole transport layer 14 made of $\alpha$-NPD to a thickness of 15 nm at an evaporation rate of 0.25 nm/s.

Over the hole transport layer, an emitter layer 15 made of BPBA was formed to a thickness of 48 nm at an evaporation rate of 0.07 nm/s. Over the emitter layer 15, an electron injection transport layer 16a composed of the compound (1) was formed to a thickness of 35 nm at an evaporation rate of 0.2 nm/s.

Over the electron injection transport layer, a cathode 17 made of an aluminum-scandium-lithium alloy was pattern-formed to a thickness of 30 nm by the co-deposition method in which aluminum containing 1.5 wt. % of scandium and lithium were evaporated from different evaporation sources respectively.

Over the cathode, an aluminum-scandium alloy containing 1.5 wt. % of scandium was formed to a thickness of 300 nm as a protective layer 18 for the cathode 17 by the RF sputtering in an argon gas.

Finally, the resulting device was sealed in an Ar gas atmosphere. In Example 106A, the concentrations of lithium and scandium in the cathode 17 were determined by ICP-AES.

Figure 8:
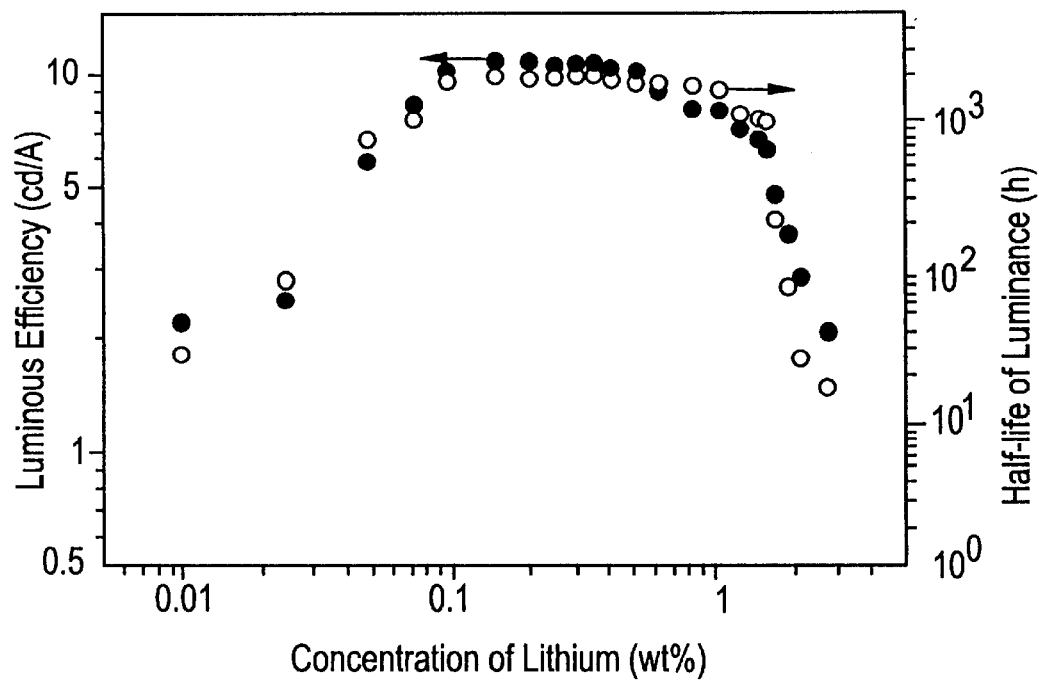
FIG. 8 is a graph illustrating luminous efficiency and luminance half-life of the cathode of Example 106A as a function of its lithium concentration.

FIG. 8 is a graph illustrating the luminous efficiency (●). and luminance half-life (○) of the cathode 17 as a function of its lithium concentration. The luminous efficiency varies with the lithium concentration of the cathode 17 and becomes 6 to 10.5 cd/A at a concentration range of 0.05 to 1.5 wt. %. Particularly within a concentration range as wide as 0.1 to 0.5 wt. %, the luminous efficiency is as high as about 10 cd/A. The luminance half-life exceeds 800 hours within a concentration range of 0.05 to 1.5 wt. % and above all, it exceeds 1500 hours at a concentration range of 0.1 to 0.5 wt. %. At a concentration outside the above range, that is, at a concentration less than 0.05 wt. % or greater than 1.5 wt. %, not only the luminous efficiency but also luminance half-life decreases to half of that within the above-described range and luminance half-life becomes even to 300 hours or less.

The adhesion of the cathode portion 17 was measured by peeling in the crosshatching test. The cathode 17 having a lithium concentration of 0.05 to 1.5 wt. % showed the highest load of 1800 to 2200 gf/24 mm, while that having a lithium concentration less than 0.05 wt. % showed the load of 1000 gf/24 mm and that having a lithium concentration greater than 1.5 wt. % showed the load of 1200 gf/24 mm.

In this Example, when the cathode 17 made of a scandium-containing aluminum-lithium alloy had a lithium concentration of 0.05 to 1.5 wt. %, good properties were attained and particularly at a lithium concentration of 0.1 to 0.5 wt. %, luminous efficiency was high and lifetime properties were stable. This result suggests that, with respect to organic thin-film EL devices having the device structure shown in FIG. 4, an organic thin-film EL device having excellent properties can be obtained by incorporating the Compound (1) in the electron injection transport layer 16a contiguous to the cathode 17 made of a scandium-containing aluminum-lithium alloy and setting the lithium concentration in the cathode 17 at a range of 0.05 to 1.5 wt. %, preferably 0.1 to 0.5 wt. %.

EXAMPLES 107A to 126A

In each of Examples 107A to 126A, in a similar manner to Example 106A except that each of the compounds shown in Tables 24 was used for the electron injection transport layer 16a of FIG. 4, an organic thin-film EL device was formed and its properties were evaluated. The results are shown in Tables 24.

Even if any one of the above-described compounds was employed for the electron injection transport layer 16a, when the cathode 17 made of a scandium-containing aluminum-lithium alloy had a lithium concentration ranging from 0.05 to 1.5 wt. %, luminous efficiency became about twice and luminance half-life became about three to five times when compared with those at a lithium concentration less than 0.05 wt. % or greater than 1.5 wt. %. The lithium concentration which is regarded as most suited in Comparative Example 4A is as small as 0.01 to 0.1 wt. % and its range is very narrow, while in this example, the most suited lithium concentration is as wide as 0.05 to 1.5 wt. % and good light-emitting properties are attained. This suggests that when the compound represented by the formula (I) is used for the electron injection transport layer 16a contiguous to the cathode 17, excellent advantages can be obtained at a lithium in concentration adjusted to 0.05 to 1.5 wt. %.

The adhesion of the cathode portion 17 was measured by peeling in the crosshatching test. The cathode 17 having a lithium concentration of 0.05 to 1.5 wt. % showed the highest load of 1800 to 2200 gf 124 mm, while that having a lithium concentration less than 0.05 wt. % showed the load of 550 gf/24 mm or less and that having a lithium concentration greater than 1.5 wt. % showed the load of 850 gf/24 mm or less.

The above results suggest that when the compound of the formula (I) is used for the electron injection transport layer 16a contiguous to the cathode 17, improved adhesion can be attained by setting the lithium concentration in the scandium-containing aluminum-scandium-lithium alloy cathode 17 at 0.05 to 1.5 wt. % and high efficiency and emission of long lifetime can be attained by disposing the cathode protective layer 18 on the cathode 17.

Comparative Example 4A

In a similar manner to Example 106A except that the electron injection transport layer 16a was made of the conventionally and ordinarily used Alq, an organic thin-film EL device was formed and its properties were evaluated.

Figure 12:
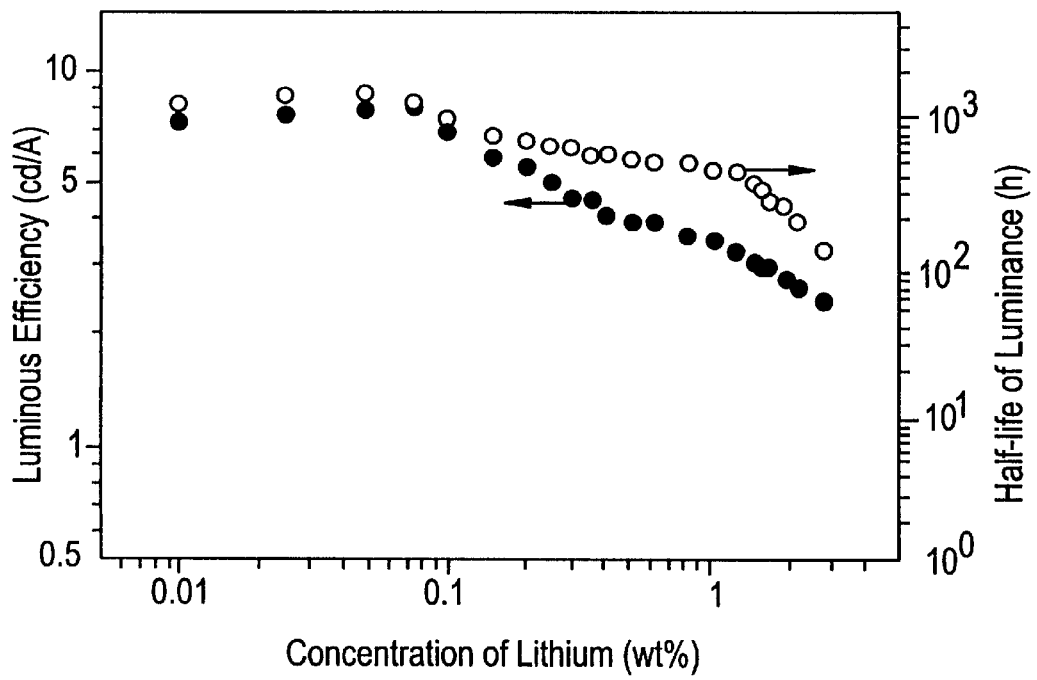
FIG. 12 is a graph illustrating luminous efficiency and luminance half-life of the cathode of Comparative Example 4A as a function of its lithium concentration.

As a result, it was observed, as illustrated in FIG. 12, that luminous efficiency and lifetime properties each showed a peak within a lithium concentration range from 0.01 to 0.1 wt. %. At the lithium concentration exceeding 0.1 wt. %, a drastic deterioration in luminous properties was observed.

The adhesion of the cathode portion was measured by peeling in the crosshatching test. As a result, the load was 1000 to 1200 gf/24 mm and showed the highest value when the cathode 17 having a lithium concentration of 0.01 to 0.1 wt. % was employed, while it was 900 gf/24 mm when the cathode 17 having a lithium concentration exceeding 0.1 wt. % was employed.

TABLE 19

|  | Compound No. | Luminous Efficiency (Maximum Value) Relative to Li Concentration (cd/A) | | | Luminance Half-life (Maximum Value) Relative to Li Concentration (h) | | |
| --- | --- | --- | --- | --- | --- | --- | --- |
|  |  | Less than 0.05 wt % | 0.05~ 1.5 wt % | More than 1.5 wt % | Less than 0.05 wt % | 0.05~ 1.5 wt % | More than 1.5 wt % |
| Example 1A | (1) | <3.9 | 7.2 | <3.1 | <500 | 1350 | <380 |
| Example 2A | (4) | <4.0 | 7.8 | <3.5 | <360 | 1500 | <450 |
| Example 3A | (5) | <3.5 | 6.5 | <3.0 | <360 | 1400 | <400 |
| Example 4A | (15) | <2.5 | 5.5 | <3.0 | <240 | 1000 | <400 |
| Example 5A | (17) | <2.5 | 5.0 | <2.5 | <120 | 950 | <240 |
| Example 6A | (18) | <3.0 | 5.5 | <3.0 | <200 | 1000 | <240 |
| Example 7A | (19) | <3.5 | 6.0 | <3.0 | <300 | 1150 | <350 |
| Example 8A | (22) | <3.8 | 6.8 | <3.0 | <300 | 1100 | <400 |
| Example 9A | (25) | <4.0 | 7.5 | <3.0 | <450 | 1500 | <400 |
| Example 10A | (26) | <4.0 | 7.0 | <3.0 | <400 | 1200 | <360 |
| Example 11A | (29) | <3.0 | 5.5 | <3.5 | <250 | 800 | <280 |
| Example 12A | (32) | <3.5 | 6.0 | <3.5 | <350 | 950 | <350 |
| Example 13A | (48) | <3.5 | 6.5 | <3.0 | <280 | 800 | <300 |
| Example 14A | (62) | <3.5 | 6.0 | <3.5 | <300 | 750 | <250 |
| Example 15A | (63) | <3.5 | 6.0 | <3.0 | <350 | 700 | <300 |
| Example 16A | (66) | <2.8 | 5.5 | <2.5 | <250 | 680 | <280 |
| Example 17A | (69) | <3.0 | 6.0 | <3.0 | <380 | 780 | <400 |
| Example 18A | (70) | <3.0 | 6.5 | <3.5 | <400 | 680 | <300 |
| Example 19A | (72) | <2.5 | 5.8 | <2.8 | <300 | 600 | <280 |
| Example 20A | (80) | <2.4 | 5.0 | <2.5 | <250 | 550 | <180 |
| Example 21A | (82) | <2.2 | 4.5 | <1.8 | <150 | 350 | <150 |

TABLE 20

| | Compound No. | Luminous Efficiency (Maximum Value) Relative to Li Concentration (cd/A) | | | Luminance Half-Life (Maximum Value) Relative to Li Concentration (h) | | |
|---|---|---|---|---|---|---|---|
| | | Less than 0.05 wt % | 0.05~ 1.5 wt % | More than 1.5 wt % | Less than 0.05 wt % | 0.05~ 1.5 wt % | More than 1.5 wt % |
| Example 22A | (83) | <2.4 | 5.0 | <2.5 | <100 | 450 | <100 |
| Example 23A | (84) | <2.4 | 5.0 | <3.0 | <80 | 500 | <150 |
| Example 24A | (86) | <2.5 | 4.8 | <3.0 | <260 | 600 | <150 |
| Example 25A | (87) | <2.0 | 4.2 | <1.8 | <48 | 280 | <48 |
| Example 26A | (93) | <1.8 | 3.6 | <1.5 | <48 | 300 | <48 |
| Example 27A | (96) | <1.5 | 3.2 | <1.5 | <48 | 350 | <72 |
| Example 28A | (107) | <1.5 | 3.5 | <1.2 | <72 | 400 | <48 |
| Example 29A | (119) | <1.8 | 3.2 | <1.5 | <96 | 300 | <72 |
| Example 30A | (121) | <1.5 | 3.0 | <1.5 | <48 | 280 | <24 |
| Example 31A | (122) | <3.0 | 5.0 | <2.5 | <80 | 480 | <120 |
| Example 32A | (124) | <3.5 | 6.0 | <3.0 | <180 | 880 | <240 |
| Example 33A | (127) | <3.5 | 6.8 | <3.5 | <240 | 960 | <300 |
| Example 34A | (130) | <3.5 | 6.0 | <3.0 | <240 | 960 | <240 |
| Example 35A | (133) | <2.8 | 5.2 | <3.0 | <120 | 750 | <180 |
| Example 36A | (140) | <2.4 | 4.5 | <2.8 | <120 | 600 | <240 |
| Example 37A | (142) | <2.4 | 4.0 | <2.6 | <120 | 500 | <96 |
| Example 38A | (143) | <3.0 | 5.0 | <2.8 | <300 | 650 | <280 |
| Example 39A | (144) | <2.6 | 4.6 | <3.4 | <280 | 580 | <120 |
| Example 40A | (146) | <3.2 | 5.5 | <3.5 | <280 | 720 | <240 |
| Example 41A | (165) | <3.0 | 5.0 | <3.5 | <240 | 680 | <240 |
| Example 42A | (169) | <3.0 | 5.6 | <3.4 | <300 | 720 | <240 |

TABLE 21

| | Compound No. | Luminous Efficiency (Maximum Value) Relative to Li Concentration (cd/A) | | | Luminance Half-life (Maximum Value) Relative to Li Concentration | | |
|---|---|---|---|---|---|---|---|
| | | Less than 0.05 wt % | 0.05~ 1.5 wt % | More than 1.5 wt % | Less than 0.05 wt % | 0.05~ 1.5 wt % | More than 1.5 wt % |
| Example 43A | (1) | <4.2 | 8.5 | <4.3 | <450 | 1380 | <185 |
| Example 44A | (4) | <4.5 | 9.0 | <4.5 | <460 | 1200 | <240 |
| Example 45A | (5) | <4.0 | 7.8 | <4.0 | <300 | 1100 | <200 |
| Example 46A | (18) | <3.5 | 6.5 | <3.8 | <240 | 1000 | <240 |
| Example 47A | (19) | <4.0 | 7.2 | <3.5 | <320 | 1150 | <240 |
| Example 48A | (21) | <3.5 | 5.8 | <3.2 | <180 | 850 | <120 |
| Example 49A | (22) | <4.0 | 6.5 | <3.5 | <240 | 950 | <240 |
| Example 50A | (25) | <4.5 | 7.5 | <4.0 | <300 | 1200 | <300 |
| Example 51A | (26) | <4.2 | 7.0 | <3.5 | <240 | 1000 | <280 |
| Example 52A | (48) | <4.0 | 6.0 | <3.0 | <120 | 750 | <240 |
| Example 53A | (66) | <3.6 | 6.4 | <3.4 | <240 | 800 | <240 |
| Example 54A | (69) | <3.8 | 6.8 | <3.6 | <300 | 900 | <280 |
| Example 55A | (70) | <4.0 | 6.0 | <2.8 | <120 | 750 | <240 |
| Example 56A | (72) | <3.4 | 5.6 | <3.2 | <120 | 750 | <240 |
| Example 57A | (80) | <3.2 | 5.2 | <3.0 | <240 | 700 | <300 |
| Example 58A | (82) | <2.8 | 5.0 | <2.6 | <100 | 600 | <120 |
| Example 59A | (83) | <2.8 | 5.0 | <2.4 | <100 | 500 | <100 |
| Example 60A | (84) | <3.4 | 6.0 | <3.0 | <240 | 880 | <300 |
| Example 61A | (86) | <3.4 | 6.2 | <3.5 | <120 | 680 | <240 |
| Example 62A | (87) | <3.0 | 5.6 | <2.8 | <100 | 550 | <72 |
| Example 63A | (93) | <3.6 | 6.6 | <3.4 | <240 | 750 | <340 |

TABLE 22

| | Compound No. | Luminous Efficiency (Maximum Value) Relative to Li Concentration (cd/A) | | | Luminance Half-life (Maximum Value) Relative to Li Concentration (h) | | |
|---|---|---|---|---|---|---|---|
| | | Less than 0.05 wt % | 0.05~ 1.5 wt % | More than 1.5 wt % | Less than 0.05 wt % | 0.05~ 1.5 wt % | More than 1.5 wt % |
| Example 64A | (108) | <4.0 | 7.0 | <3.6 | <400 | 1100 | <350 |
| Example 65A | (109) | <3.5 | 6.0 | <3.5 | <360 | 1000 | <240 |
| Example 66A | (119) | <3.0 | 5.6 | <3.0 | <260 | 950 | <200 |
| Example 67A | (121) | <2.5 | 5.0 | <2.8 | <180 | 720 | <240 |
| Example 68A | (124) | <3.5 | 8.0 | <3.8 | <400 | 1400 | <550 |
| Example 69A | (127) | <4.2 | 9.0 | <4.5 | <450 | 1500 | <600 |
| Example 70A | (130) | <4.0 | 7.0 | <4.0 | <350 | 1000 | <400 |
| Example 71A | (133) | <3.5 | 6.4 | <3.2 | <240 | 850 | <300 |

TABLE 22-continued

|  | Compound No. | Luminous Efficiency (Maximum Value) Relative to Li Concentration (cd/A) | | | Luminance Half-life (Maximum Value) Relative to Li Concentration (h) | | |
| --- | --- | --- | --- | --- | --- | --- | --- |
|  |  | Less than 0.05 wt % | 0.05~ 1.5 wt % | More than 1.5 wt % | Less than 0.05 wt % | 0.05~ 1.5 wt % | More than 1.5 wt % |
| Example 72A | (135) | <3.2 | 5.8 | <3.0 | <240 | 720 | <240 |
| Example 73A | (140) | <3.0 | 5.5 | <3.2 | <200 | 600 | <240 |
| Example 74A | (142) | <2.8 | 5.0 | <3.0 | <120 | 580 | <240 |
| Example 75A | (143) | <3.4 | 6.0 | <3.0 | <240 | 720 | <240 |
| Example 76A | (144) | <3.0 | 5.8 | <2.5 | <240 | 600 | <180 |
| Example 77A | (146) | <3.5 | 6.5 | <3.4 | <300 | 850 | <350 |
| Example 78A | (149) | <4.2 | 9.0 | <4.8 | <500 | 1450 | <480 |
| Example 79A | (150) | <3.5 | 7.4 | <3.8 | <360 | 1100 | <500 |
| Example 80A | (165) | <3.2 | 6.5 | <2.8 | <240 | 870 | <450 |
| Example 81A | (168) | <3.5 | 7.2 | <3.2 | <300 | 1000 | <500 |
| Example 82A | (182) | <3.5 | 6.0 | <3.4 | <240 | 900 | <350 |
| Example 83A | (186) | <3.0 | 6.5 | <2.8 | <240 | 800 | <300 |
| Example 84A | (193) | <2.5 | 5.0 | <2.8 | <180 | 640 | <240 |

TABLE 23

|  | Compound No. | Luminous Efficiency (Maximum Value) Relative to Li Concentration (cd/A) | | | Luminance Half-life (Maximum Value) Relative to Li Concentration (h) | | |
| --- | --- | --- | --- | --- | --- | --- | --- |
|  |  | Less than 0.05 wt % | 0.05~ 1.5 wt % | More than 1.5 wt % | Less than 0.05 wt % | 0.05~ 1.5 wt % | More than 1.5 wt % |
| Example 85A | (1) | <4.7 | 9.5 | <3.6 | <500 | 1480 | <480 |
| Example 86A | (4) | <5.0 | 9.5 | <3.0 | <400 | 1200 | <450 |
| Example 87A | (19) | <4.0 | 7.5 | <3.0 | <360 | 1100 | <400 |
| Example 88A | (22) | <4.5 | 8.0 | <3.0 | <300 | 1000 | <360 |
| Example 89A | (25) | <5.0 | 9.0 | <3.5 | <400 | 1200 | <400 |
| Example 90A | (48) | <4.0 | 7.0 | <3.0 | <240 | 900 | <300 |
| Example 91A | (66) | <3.2 | 6.0 | <3.0 | <240 | 840 | <300 |
| Example 92A | (69) | <3.5 | 6.5 | <3.5 | <300 | 900 | <450 |
| Example 93A | (80) | <3.0 | 6.2 | <3.4 | <240 | 840 | <280 |
| Example 94A | (82) | <2.5 | 5.0 | <3.0 | <180 | 720 | <200 |
| Example 95A | (83) | <3.5 | 6.0 | <3.0 | <240 | 840 | <300 |
| Example 96A | (84) | <3.2 | 6.2 | <3.5 | <360 | 900 | <350 |
| Example 97A | (108) | <3.4 | 6.6 | <3.8 | <400 | 950 | <400 |
| Example 98A | (124) | <4.3 | 8.5 | <4.0 | <450 | 1150 | <550 |
| Example 99A | (127) | <4.5 | 9.0 | <4.2 | <500 | 1400 | <600 |
| Example 100A | (130) | <4.0 | 7.5 | <3.5 | <380 | 1000 | <400 |
| Example 101A | (140) | <3.6 | 6.0 | <3.2 | <300 | 800 | <240 |
| Example 102A | (146) | <3.6 | 6.0 | <3.5 | <240 | 720 | <240 |
| Example 103A | (149) | <3.6 | 5.5 | <3.2 | <240 | 600 | <200 |
| Example 104A | (182) | <3.4 | 6.0 | <3.0 | <300 | 900 | <450 |
| Example 105A | (186) | <3.2 | 5.8 | <2.8 | <240 | 680 | <200 |

TABLE 24

|  | Compound No. | Luminous Efficiency (Maximum Value) Relative to Li Concentration (cd/A) | | | Luminance Half-life (Maximum Value) Relative to Li Concentration (h) | | |
| --- | --- | --- | --- | --- | --- | --- | --- |
|  |  | Less than 0.05 wt % | 0.05~ 1.5 wt % | More then 1.5 wt % | Less than 0.05 wt % | 0.05~ 1.5 wt % | More than 1.5 wt % |
| Example 106A | (1) | <4.8 | 9.8 | <4.5 | <580 | 1680 | <400 |
| Example 107A | (4) | <5.0 | 10.2 | <5.3 | <360 | 1650 | <450 |
| Example 108A | (5) | <4.6 | 8.5 | <4.2 | <300 | 1500 | <400 |
| Example 109A | (19) | <4.0 | 8.0 | <3.8 | <300 | 1250 | <360 |
| Example 110A | (108) | <3.5 | 6.8 | <3.2 | <240 | 960 | <300 |
| Example 111A | (109) | <3.0 | 6.0 | <3.0 | <240 | 900 | <240 |
| Example 112A | (124) | <4.6 | 8.0 | <4.0 | <300 | 1350 | <480 |
| Example 113A | (127) | <5.2 | 10.5 | <5.0 | <450 | 1650 | <720 |
| Example 114A | (130) | <4.3 | 8.5 | <4.5 | <380 | 1250 | <500 |
| Example 115A | (133) | <4.0 | 7.8 | <4.2 | <380 | 1100 | <420 |
| Example 116A | (137) | <3.5 | 5.8 | <2.9 | <240 | 680 | <300 |
| Example 117A | (179) | <3.2 | 6.5 | <3.4 | <300 | 840 | <120 |
| Example 118A | (182) | <4.5 | 8.5 | <4.8 | <480 | 1150 | <480 |
| Example 119A | (184) | <3.0 | 6.2 | <3.5 | <240 | 720 | <240 |
| Example 120A | (185) | <3.4 | 4.2 | <3.2 | <180 | 580 | <240 |
| Example 121A | (186) | <4.2 | 7.2 | <4.1 | <380 | 950 | <400 |

TABLE 24-continued

| | | Luminous Efficiency (Maximum Value) Relative to Li Concentration (cd/A) | | | Luminance Half-life (Maximum Value) Relative to Li Concentration (h) | | |
|---|---|---|---|---|---|---|---|
| | Compound No. | Less than 0.05 wt % | 0.05~ 1.5 wt % | More then 1.5 wt % | Less than 0.05 wt % | 0.05~ 1.5 wt % | More than 1.5 wt % |
| Example 122A | (187) | <3.8 | 6.0 | <3.2 | <200 | 640 | <180 |
| Example 123A | (188) | <3.5 | 5.0 | <2.8 | <180 | 550 | <240 |
| Example 124A | (189) | <4.2 | 5.5 | <3.2 | <240 | 600 | <300 |
| Example 125A | (192) | <3.8 | 4.8 | <3.5 | <100 | 500 | <120 |
| Example 126A | (193) | <3.0 | 6.0 | <2.8 | <240 | 720 | <200 |

EXAMPLE 1B

FIG. 1 is a schematic cross-sectional view illustrating the structure of an organic thin-film EL device according to a first embodiment of the present invention, wherein an organic thin-film layer contiguous to a cathode 17 is an emitter layer 15. Example 1B of the present invention will next be described with reference to FIG. 1.

On a glass substrate 11, a film of ITO (indium tin oxide) was formed by the ion plating method. The film was etched into short strips, whereby the glass substrate with an anode 12 was formed. The anode 12 made of ITO had a sheet resistance of 13 Ω/□.

All the organic thin films over the ITO-adhered glass substrate were formed by the molecular-beam deposition method and the vacuum degree during film formation was set at $2 \times 10^{-8}$ Torr or less. At an evaporation rate of 0.05 nm/s, a hole injection layer 13 made of tris(4-(4'-(N,N-di (4-tolyl)amino)styryl) phenyltriphenylamine) (which will hereinafter be abbreviated as "TTPA") was formed to a thickness of 35 nm, followed by the formation of a hole transport layer 14 made of N,N'-diphenyl-N,N'-bis(a-naphthyl)-1,1'-biphenyl-4,4'-diamine (which will hereinafter be abbreviated as "α-NPD") was formed to a thickness of 25 nm at an evaporation rate of 0.25 nm/sp Over the hole transport layer, an emitter layer 15 was formed by the co-deposition method, that is, by evaporating Compound (1) in Table 1 and diphenyl 3,9-perylenedicarboxylate from different deposition sources, respectively. At that time, the evaporation rate was precisely controlled so that the diphenyl 3,9-perylenedicarboxylate was contained in the emitter layer in an amount of 3 mole %, whereby the emitter layer 15 having a thickness of 70 nm was formed.

Over the emitter layer, a cathode 17 made of a magnesium-lithium alloy was pattern formed to a thickness of 150 nm by the co-deposition method in which magnesium and lithium were evaporated from different evaporation sources respectively.

Lastly, the device was sealed in an Ar gas atmosphere. Incidentally, the concentration of lithium in the cathode 17 employed in this example was determined by the inductively coupled plasma emission spectrometry (ICP-AES).

The organic thin-film EL device was electrified and luminous efficiency and lifetime properties (luminance half-life) were evaluated. The luminous efficiency (cd/A) was found from a current density at the time when luminance of 300 cd/m 2was emitted. Lifetime properties were evaluated by causing the light emission of the device by the pulse operation at a pulse frequency of 100 Hz, duty ratio of 50% and peak current density of 10 mA/cm². While the pulse was off, reverse bias voltage of −10 V was applied.

Figure 13:
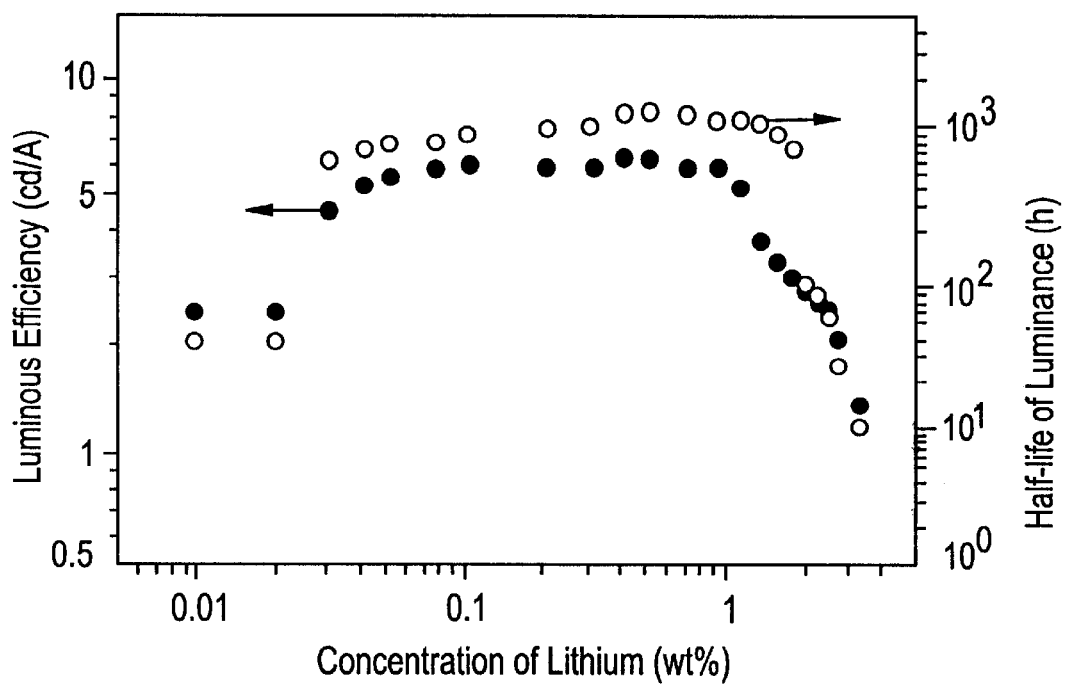
FIG. 13 is a graph illustrating luminous efficiency and luminance half-life of the cathode of Example 1B as a function of its lithium concentration.

FIG. 13 is a graph illustrating the luminous efficiency (●) and luminance half-life (○) of the cathode 17 as a function of its lithium concentration. The luminous efficiency varies with the lithium concentration of the cathode 17 and becomes 3.0 to 6.1 cd/A at a concentration range of 0.03 to 1.7 wt. %. Particularly within a concentration range of 0.03 to 1.0 wt. %, the luminous efficiency shows a stable value not less than about 5 cd/A. The luminance half-life exceeds 500 hours within a concentration range of 0.03 to 1.7 wt. %. At a concentration range less than 0.03 wt. % or greater than 1.7 wt. %, not only luminous efficiency shows a marked decrease but also luminance half-life is considerably short and does not reach even 100 hours.

The adhesion of the cathode 17 was measured by peeling in the crosshatching test. The cathode 17 having a lithium concentration of 0.03 to 1.7 wt. % showed the highest load of 1350 to 1750 gf/24 mm, while that having a lithium concentration less than 0.03 wt. % showed the load of 550 gf/24 mm or less and that having a lithium concentration greater than 1.7 wt. % showed the load of 750 gf/24 mm or less.

In this example, when the lithium concentration of the magnesium alloy cathode 17 ranges from 0.03 to 1.7 wt. %, good properties were attained and particularly at a lithium concentration of 0.03 to 1.0 wt. %, high efficiency and stable lifetime properties were attained. This result suggests that an organic thin-film EL device having excellent properties can be obtained by incorporating Compound (1) in the thin-film emitter layer 15 contiguous to the magnesium-lithium cathode 17 and setting the lithium concentration in the cathode 17 at a range of 0.03 to 1.7 wt. %, preferably 0.03 to 1.0 wt. %.

EXAMPLES 2B to 42B

In each of Examples 2B to 42B, except that the emitter layer 15 having a thickness of 70 nm was formed by co-deposition method in which each of the compounds shown in Tables 25 and 26 as a compound of the formula (I) and diphenyl 3, 9-perylenedicarboxylate were evaporated from different deposition sources, respectively, wherein the evaporation rate was precisely controlled so that the diphenyl 3, 9-perylenedicarboxylate was contained in the emitter layer 15 in an amount of 3 mole %, an organic thin-film EL device was formed in a similar manner to Example 1B, and its properties were evaluated. The results are shown in Tables 25 and 26.

Even if any one of the above-described compounds was employed for the emitter layer 15, when the magnesium-lithium alloy cathode 17 had a lithium concentration ranging from 0.03 to 1.7 wt. %, luminous efficiency became about twice and luminance half-life became about three to ten times when compared with those at a lithium concentration less than 0.03 wt. % or greater than 1.7 wt. %. This suggests that when the compound represented by the formula (I) is used for an emitter layer 15 contiguous to the cathode 17, excellent advantages can be obtained at a lithium concentration adjusted to 0.03 to 1.7 wt. %.

The adhesion of the cathode portion 17 was measured by peeling in the crosshatching test. The cathode 17 having a lithium concentration of 0.03 to 1.7 wt. % showed the highest load of 1200 to 1800 gf/24 mm, while that having a lithium concentration less than 0.03 wt. % showed the load of 450 gf/24 mm or less and that having a lithium concentration greater than 1.7 wt. % showed the load of 800 gf/24 mm or less.

The above results indicate that when the compound of the formula (I) is used for an emitter layer 15 contiguous to the cathode 17, improved adhesion, high efficiency and long-life light emission can be attained by adjusting the lithium concentration in the magnesium-lithium alloy cathode 17 at 0.03 to 1.7 wt. %.

Comparative Example 1B

Except that the emitter layer 15 having a thickness of 70 nm was formed by a co-deposition method in which conventionally and ordinarily used Alq and diphenyl 3, 9-perylenedicarboxylate were evaporated from different deposition sources, respectively, wherein the evaporation rate was precisely controlled so that the diphenyl 3, 9-perylenedicarboxylate was contained in the emitter layer 15 in an amount of 3 mole %, an organic thin-film EL device was formed in a similar manner to Example 1B, and its properties were evaluated.

Figures 16, 17:
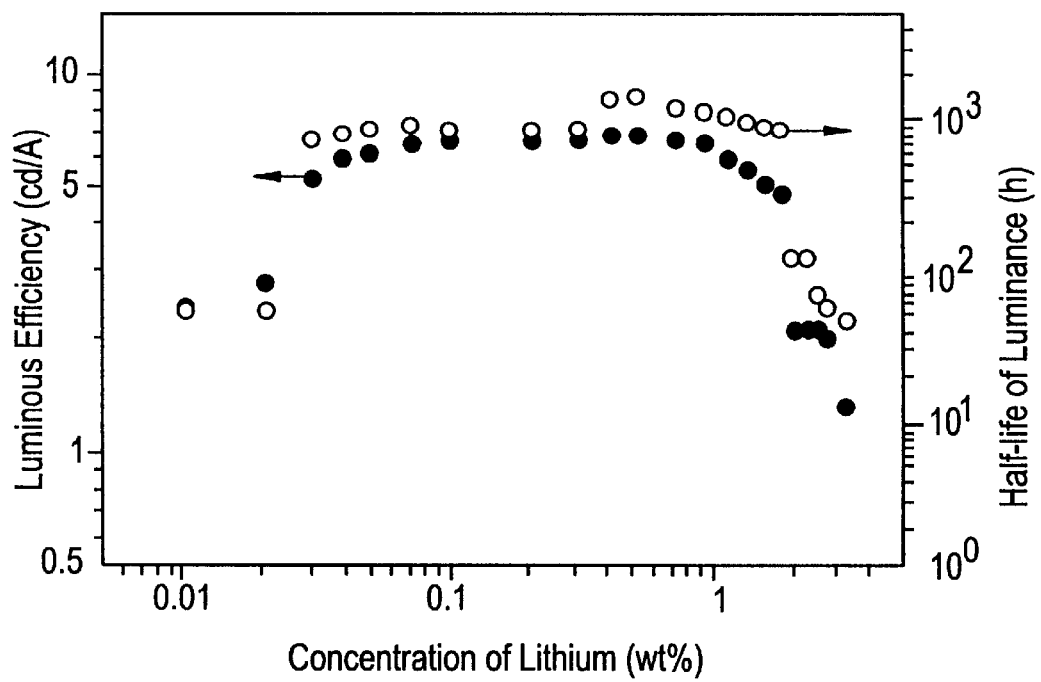
FIG. 16 is a graph illustrating luminous efficiency and luminance half-life of the cathode of Example 106B as a function of its lithium concentration.
FIG. 17 is a graph illustrating luminous efficiency and luminance half-life of the cathode of Comparative Example 1B as a function of its lithium concentration.

As a result, it was observed, as illustrated in FIG. 17, that luminous efficiency and lifetime properties each showed a peak at a lithium concentration range exceeding 1.7 wt. %. Such a high lithium concentration range is not however preferred, because corrosion or black spots tend to appear on the electrode.

When the adhesion of the cathode portion was measured by peeling in the crosshatching test. As a result, the load was 1000 to 1200 gf/24 mm and showed the highest value when the cathode 17 having a lithium concentration exceeding 1.7 wt. % was employed, while it was 900 gf/24 mm or less when the cathode 17 having a lithium concentration less than 1.7 wt. % was employed.

EXAMPLE 43B

FIG. 2 is a schematic cross-sectional view illustrating the structure of an organic thin-film EL device according to a second embodiment of the present invention, wherein an organic thin film contiguous to a cathode 17 is an electron injection transport layer 16a and functions of an emitter layer 15 and electron injection transport layer 16a are essentially separated.

Example 43B of the present invention will next be described with reference to FIG. 2. On a glass substrate 11, an ITO (indium tin oxide) film was formed by the ion plating method, followed by etching into short strips, whereby a glass substrate with an anode 12 was formed. The anode 12 made of ITO had a sheet resistance of 13 Ω/□. Organic thin films over the ITO-applied glass substrate were all formed by the molecular-beam deposition method and the vacuum degree during the film formation was set at $2 \times 10^{-8}$ Torr or less.

A hole injection layer 13 made of TTPA was then formed to a thickness of 35 nm at an evaporation rate of 0.05 nm/s, followed by the formation of a hole transport layer 14 made of α-NPD to a thickness of 15 nm at an evaporation rate of 0.25 nm/s.

Over the hole transport layer, an emitter layer 15 made of 9,10-bis(4-(4-(N,N-di(4-tolyl)aminophenyl) benzyliden) anthracene (which will hereinafter be abbreviated as "BPBA") was formed to a thickness of 48 nm at an evaporation rate of 0.07 nm/s.

Over the emitter layer 15, an electron injection transport layer 16a made of the compound (1) in Table 1 was formed to a thickness of 35 nm at an evaporation rate of 0.2 nm/s.

Then, a cathode 17 made of a magnesium-lithium alloy was pattern-formed to a thickness of 150 nm over the electron injection transport layer by the co-deposition method in which magnesium and lithium were evaporated from different evaporation sources, respectively.

Finally, the resulting device was sealed in an Ar gas atmosphere. In Example 43B, the concentration of lithium in the cathode 17 was determined by ICP-AES.

The organic thin film EL device so formed was electrified and luminous efficiency and lifetime properties (luminance half-life) were evaluated. The luminous efficiency (cd/A) was found from a current density at the time when luminance of 300 cd/m$^2$ was emitted. Lifetime properties were evaluated by causing the light emission of the device by the pulse operation at a pulse frequency of 100 Hz, duty ratio of 50% and peak current density of 10 mA/cm$^2$. While the pulse was off, reverse bias voltage of −10V was applied.

Figures 14, 15:
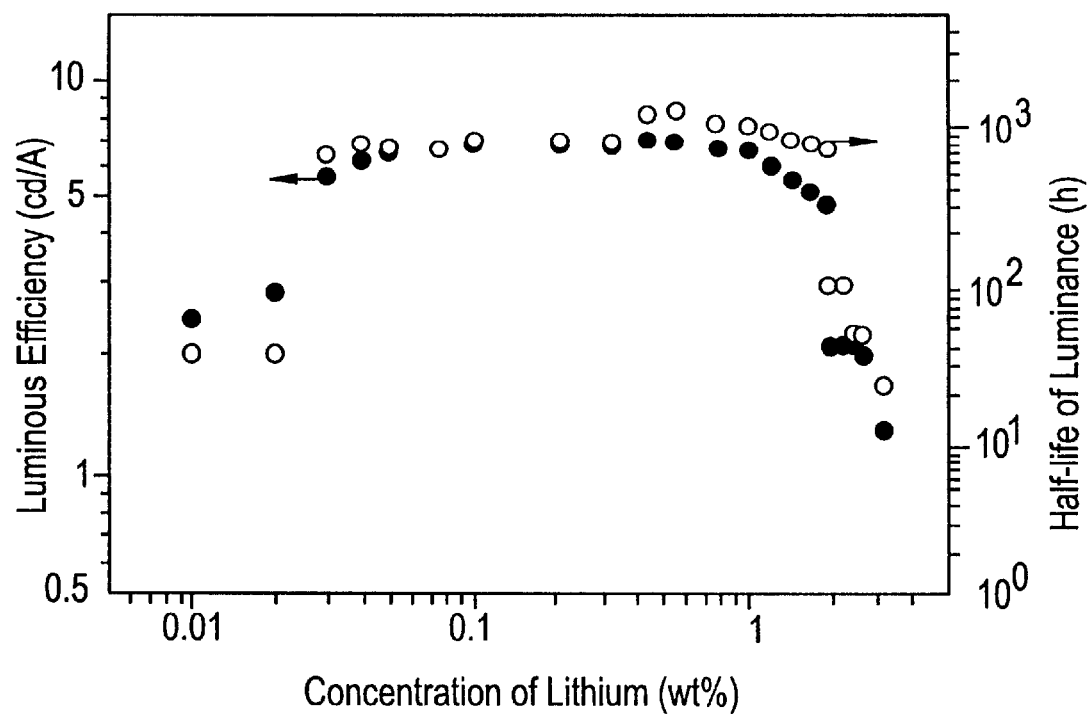
FIG. 14 is a graph illustrating luminous efficiency and luminance half-life of the cathode of Example 43B as a function of its lithium concentration.
FIG. 15 is a graph illustrating luminous efficiency and luminance half-life of the cathode of Example 85B as a function of its lithium concentration.

FIG. 14 is a graph illustrating the luminous efficiency (●) and luminance half-life (○) of the cathode 17 as a function of its lithium concentration. The luminous efficiency varies with the lithium concentration of the cathode 17 and becomes 5.5 to 7.1 cd/A at a concentration range of 0.03 to 1.7 wt. %. The luminance half-life exceeded 400 hours within a concentration range of 0.03 to 1.7 wt. %. At a concentration outside the above range, that is, a range less than 0.03 wt. % or greater than 1.7 wt. %, luminous efficiency decreased to about half of that within the above range and luminance half-life became even as short as 120 hours or less.

The adhesion of the cathode portion 17 was measured by peeling in the crosshatching test. The cathode 17 having a lithium concentration of 0.03 to 1.7 wt. % showed the highest load of 1500 to 1800 gf/24 mm, while that having a lithium concentration less than 0.03 wt. % showed the load of 550 gf/24 mm or less and that having a lithium concentration greater than 1.7 wt. % showed the load of 850 gf/24 mm or less.

In this Example 43B, when the lithium concentration in the magnesium alloy cathode 17 falls within a range of 0.03 to 1.7 wt. %, good properties were attained. This result suggests that, with respect to organic thin-film EL devices having the device structure shown in FIG. 2, an organic thin-film EL device having excellent properties can be obtained by incorporating Compound (1) of Table 1 in the electron injection transport layer 16a contiguous to the cathode 17 made of a magnesium-lithium alloy and setting the lithium concentration range in the cathode 17 at 0.03 to 1.7 wt. %.

EXAMPLES 44B to 84B

In each of Examples 44B to 84B, in a similar manner to Example 43B except that each of the compounds shown in Tables 27 and 28 was used as the compound of the formula (I) for forming the electron injection transport layer 16a of FIG. 2, an organic thin-film EL device was formed and its properties were evaluated. Results are shown in Tables 27 and 28.

Even if any one of the above-described compounds were employed as the hole injection transport layer 16a, when the magnesium-lithium alloy cathode 17 had a lithium concentration ranging from 0.03 to 1.7 wt. %, luminous efficiency became about twice and luminance half-life became about three to ten times when compared with those at a lithium concentration less than 0.03 wt. % or greater than 1.7 wt. %. This suggests that when the compound represented by the formula (I) is used for the electron injection transport layer 16a contiguous to the magnesium-lithium alloy cathode 17, excellent advantages can be obtained at a lithium concentration adjusted to 0.03 to 1.7 wt. %.

The adhesion of the cathode portion 17 was measured by peeling in the crosshatching test. The cathode 17 having a lithium concentration of 0.03 to 1.7 wt. % showed the highest load of 1200 to 1800 gf/24 mm, while that having a lithium concentration less than 0.03 wt. % showed the load of 550 gf/24 mm or less and that having a lithium concentration greater than 1.7 wt. % showed the load of 850 gf/24 mm or less.

The above results suggest that when the compound of the formula (I) is used for the electron injection transport layer 16a contiguous to the cathode 17, improved adhesion, high efficiency and long-life light emission can be attained by adjusting the lithium concentration in the cathode 17 made of a magnesium-lithium alloy at 0.03 to 1.7 wt. %.

Comparative Example 2B

Figure 18:
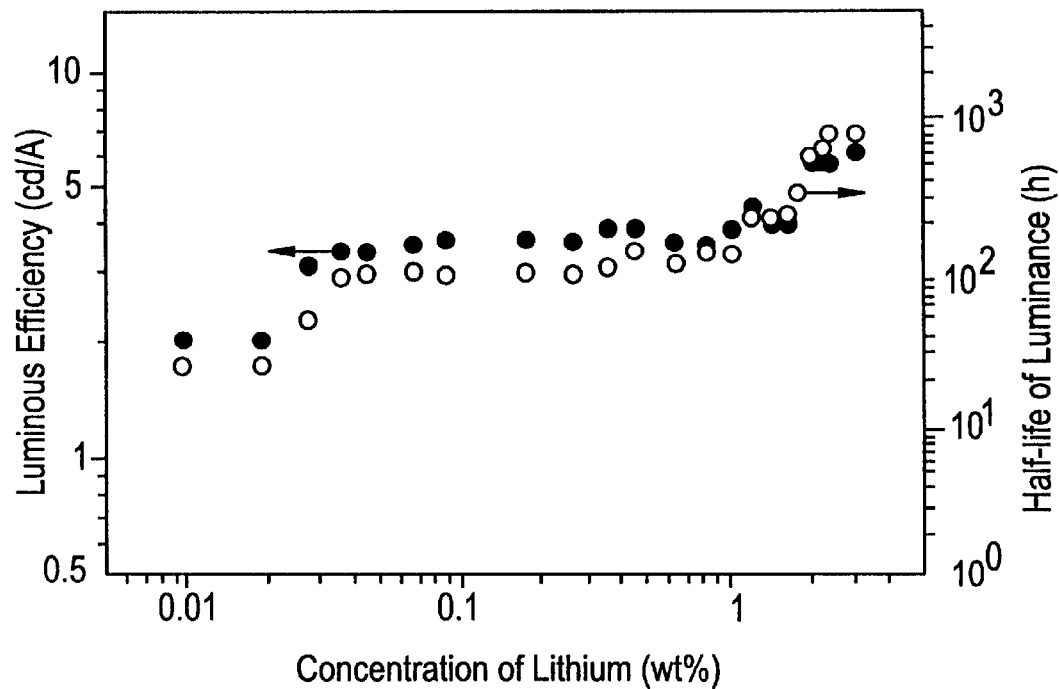
FIG. 18 is a graph illustrating luminous efficiency and luminance half-life of the cathode of Comparative Example 2B as a function of its lithium concentration.

In a similar manner to Example 43B except that conventionally and ordinarily used Alq was used for the formation of the electron injection transport layer 16a, an organic thin-film EL device was formed and its properties were evaluated. As a result, it was observed, as illustrated in FIG. 18, that luminous efficiency and lifetime properties each showed a peak in a range of the lithium concentration exceeding 1.7 wt. %. Such a high lithium concentration range is not preferred because corrosion or black spots tend to appear.

The adhesion of the cathode portion 17 was measured by peeling in the crosshatching test. As a result, the load was 1000 to 1200 gf/24 mm and showed the highest value when the cathode 17 having a lithium concentration exceeding 1.7 wt. % was employed, while it was 900 gf/24 mm or less when the cathode 17 having a lithium concentration not greater than 1.7 wt. % was employed.

EXAMPLE 85B

FIG. 3 is a schematic cross-sectional view illustrating the structure of an organic thin-film EL device according to a third embodiment of the present invention, which is different from the structure of the second embodiment in that at least one of the cathode components is contained in the electron injection transport layer 16b contiguous to the cathode 17.

Example 85B of the present invention will next be described with reference to FIG. 3. On a glass substrate 11, an ITO (indium tin oxide) film was formed by the ion plating method, followed by etching into short strips, whereby a glass substrate with an anode 12 was formed. The anode 12 made of ITO had a sheet resistance of 13 Ω/□. The organic thin films over the ITO-applied glass substrate were all formed by the molecular-beam deposition method and the vacuum degree during the film formation was set at $2 \times 10^{-8}$ Torr or less.

A hole injection layer 13 made of TTPA was then formed to a thickness of 35 nm at an evaporation rate of 0.05 nm/s, followed by the formation of a hole transport layer 14 made of A-NPD to a thickness of 25 nm at an evaporation rate of 0.25 nm/s.

Over the hole transport layer, an emitter layer 15 made of BPBA was formed to a thickness of 48 nm at an evaporation rate of 0.07 nm/s. Over the emitter layer 15, an electron injection transport layer 16b containing 1.5 wt. % of lithium was formed to a thickness of 35 nm by the co-deposition method in which lithium and the compound (1) were evaporated as electron transport materials from different evaporation sources, respectively.

Then, a cathode 17 made of a magnesium-lithium alloy was pattern-formed to a thickness of 150 nm over the electron injection transport layer by the co-deposition method in which magnesium and lithium were evaporated from different evaporation sources respectively.

Finally, the resulting device was sealed in an Ar gas atmosphere. In this Example 85B, the concentration of lithium in the cathode 17 was determined by ICP-AES.

FIG. 15 is a graph illustrating the luminous efficiency (●) and luminance half-life (○) of the cathode 17 as a function of its lithium concentration. The luminous efficiency varies with the lithium concentration of the cathode 17 and became 6.4 to 8.4 cd/A in a concentration range of 0.03 to 1.7 wt. %. The luminance half-life was not less than 440 hours within a concentration range of 0.03 to 1.7 wt. %. At a concentration outside the above range, that is, a range of less than 0.03 wt. % or greater than 1.7 wt. %, not only luminous efficiency but also luminance half-life decreased to half or less of that within the above range and luminance half-life became even 120 hours or less. In addition, in this Example 85B, the luminous efficiency and lifetime properties were improved by about 10 to 20% when compared with those of Example 43B. Such an improvement in the properties was brought about by doping lithium, which is one of the cathode components, into the electron injection transport layer 16b of the organic thin-film EL device of the present invention.

The adhesion of the cathode portion 17 was measured by peeling in the crosshatching test. The cathode 17 having a lithium concentration of 0.03 to 1.7 wt. % showed the highest load of 1750 to 2150 gf/24 mm, while that having a lithium concentration less than 0.03 wt. % showed the load of 900 gf/24 mm and that having a lithium concentration greater than 1.7 wt. % showed the load of 1100 gf/24 mm. The adhesion was improved by 1.2 times when compared with that in Example 43B. Such an improvement in the properties was brought about by doping lithium, which is one of the cathode components, into the electron injection transport layer 16b of the present invention, thereby improving the adhesion.

In this Example, when the magnesium alloy cathode 17 had a lithium concentration of 0.03 to 1.7 wt. %, properties were good. This result suggests that, with respect to organic thin-film EL devices having the device structure shown in FIG. 3, an organic thin film EL device having excellent properties can be obtained by incorporating Compound (1) in the electron injection transport layer 16b contiguous to the cathode 17 made of a magnesium-lithium alloy and setting the lithium concentration in the cathode 17 at 0.03 to 1.7 wt.

EXAMPLES 86B to 105B

In each of Examples 86B to 105B, in a similar manner to Example 85B except that each of the compounds shown in Tables 29 was used for the electron injection transport layer 16b of FIG. 3, an organic thin-film EL device was formed and its properties were evaluated. Results are shown in Tables 29.

Even if any one of the above-described compounds were employed as the electron injection transport layer 16b, when the magnesium-lithium alloy cathode 17 had a lithium concentration ranging from 0.03 to 1.7 wt. %, luminous efficiency became about twice and luminance half-life became about three to nine times when compared with those at a lithium concentration less than 0.03 wt. % or greater than 1.7 wt. %. This suggests that when the compound represented by the formula (I) is used for the electron injection transport layer 16b contiguous to the cathode 17 of the organic thin-film EL device illustrated in FIG. 3, excellent advantages can be obtained at a lithium concentration adjusted to 0.03 to 1.7 wt. %.

The adhesion of the cathode portion 17 was measured by peeling in the crosshatching test. The cathode 17 having a lithium concentration of 0.03 to 1.7 wt. % showed the highest load of 1750 to 2150 gf/24 mm, while that having a lithium concentration less than 0.03 wt. % showed the load of 900 gf/24 mm or less and that having a lithium concentration greater than 1.7 wt. % showed the load of 1100 gf/24 mm or less.

The above results suggest that when the compound of the formula (I) is used for the electron injection transport layer 16b contiguous to the cathode 17, improved adhesion, high efficiency and long-life light emission can be attained by adjusting the lithium concentration in the cathode 17 made of an magnesium-lithium alloy at 0.03 to 1.7 wt. %.

Comparative Example 3B

Figure 19:
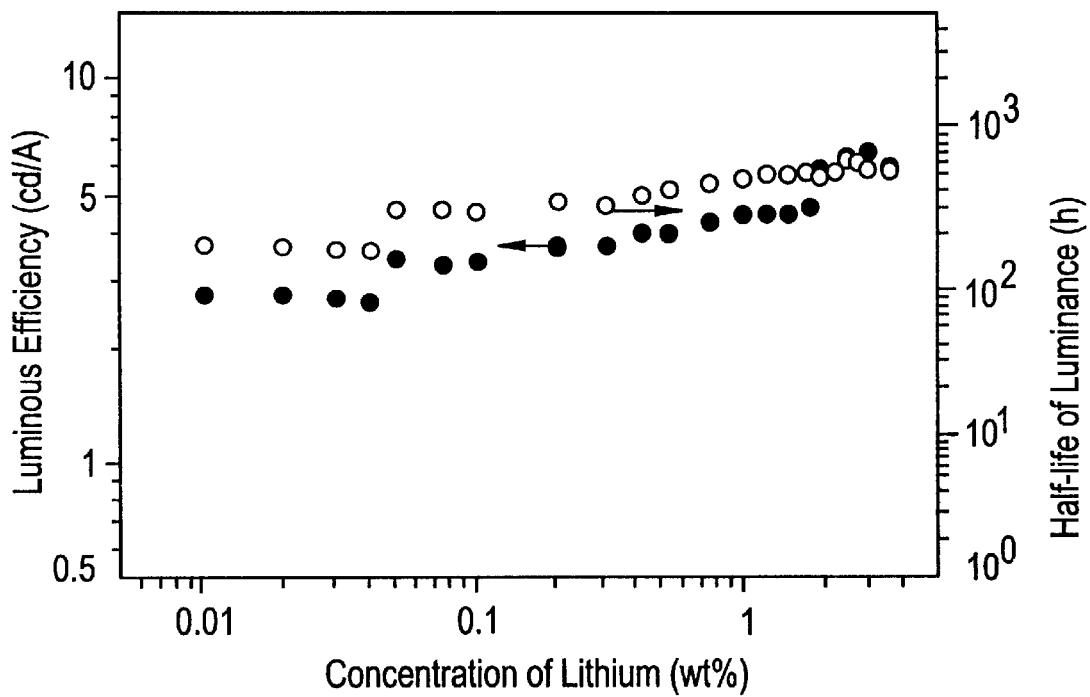
FIG. 19 is a graph illustrating luminous efficiency and luminance half-life of the cathode of Comparative Example 3B as a function of its lithium concentration.

In a similar manner to Example 85B except that the electron injection transport layer 16b was formed by doping lithium into a layer composed of conventionally and ordinarily used Alq, an organic thin-film EL device was formed and its properties were evaluated. As a result, it was observed, as illustrated in FIG. 19, that luminous efficiency and lifetime properties each showed a peak in a range of the lithium concentration exceeding 1.7 wt %.

The adhesion of the cathode portion 17 was measured by peeling in the crosshatching test. As a result, the load was 1000 to 1200 gf/24 mm and showed the highest value when the cathode 17 having a lithium concentration exceeding 1.7 wt. % was employed, while it was 900 gf/24 mm or less when the cathode 17 having a lithium concentration not greater than 1.7 wt. % was employed.

EXAMPLE 106B

FIG. 4 is a schematic cross-sectional view illustrating the structure of an organic thin-film EL device according to a fourth embodiment of the present invention, which is different from the structures of the other embodiments in that a cathode protective layer 18 is disposed over a cathode 17.

Example 106B of the present invention will next be described with reference to FIG. 4. On a glass substrate 11, an ITO (indium tin oxide) film was formed by the ion plating method, followed by etching into short strips, whereby a glass substrate with an anode 12 was formed. The anode 12 made of ITO had a sheet resistance of 13 Ω/□. Organic thin films over the ITO-applied glass substrate were all formed by the molecular-beam deposition method and the vacuum degree during the film formation was set at $2 \times 10^{-8}$ Torr or less.

A hole injection layer 13 made of TTPA was then formed to a thickness of 35 nm at an evaporation rate of 0.05 nm/s, followed by the formation of a hole transport layer 14 made of a-NPD to a thickness of 15 nm at an evaporation rate of 0.25 nm/s.

Over the hole transport layer, an emitter layer 15 made of BPBA was formed to a thickness of 48 nm at an evaporation rate of 0.07 nm/s. Over the emitter layer 15, an electron injection transport layer 16a composed of the compound (1) was formed to a thickness of 35 nm at an evaporation rate of 0.2 nm/s.

Over the electron injection transport layer, a cathode 17 made of a magnesium-lithium alloy was pattern-formed to a thickness of 30 nm by the co-deposition method in which magnesium and lithium were evaporated from different evaporation sources respectively. Over the cathode, an aluminum-scandium alloy was formed to a thickness of 300 nm as a protective layer 18 for the cathode 17 by the RF sputtering method.

Finally, the resulting device was sealed in an Ar gas atmosphere. In this Example 106B, the concentration of lithium in the cathode 17 was determined by ICP-AES.

FIG. 16 is a graph illustrating the luminous efficiency (●) and luminance half-life (○) of the cathode 17 as a function of its lithium concentration. The luminous efficiency varies with the lithium concentration of the cathode 17 and becomes 5.0 to 7.1 cd/A at a concentration range of 0.03 to 1.7 wt. %. The luminance half-life exceeds 700 hours within a concentration range of 0.03 to 1.7 wt. % and above all, it exceeds 1000 hours at a concentration range of 0.4 to 1.0 wt. %. At a concentration outside the above range, that is, at a concentration less than 0.03 wt. % or greater than 1.7 wt. %, on the other hand, not only the luminous efficiency decreases to half or less than that within the above range but also luminance half-life decreases even as short as 100 hours or less.

The adhesion of the cathode portion 17 was measured by peeling in the crosshatching test. The cathode 17 having a lithium concentration of 0.03 to 1.7 wt. % showed the highest load of 1500 to 1800 gf/24 mm, while that having a lithium concentration less than 0.03 wt. % showed the load of 550 gf/24 mm and that having a lithium concentration greater than 1.7 wt. % showed the load of 850 gf/24 mm.

In this Example, when the magnesium alloy cathode 17 had a lithium concentration of 0.03 to 1.7 wt. %, properties were good and particularly at a lithium concentration of 0.4 to 1.0 wt. %, luminous efficiency was high and lifetime properties were stable. This result suggests that, with respect to organic thin-film EL devices having the device structure shown in FIG. 4, an organic thin-film EL device having excellent properties can be obtained by incorporating the Compound (1) in the electron injection transport layer 16a contiguous to the cathode 17 made of a magnesium and lithium alloy and setting the lithium concentration in the cathode 17 at a range of 0.03 to 1.7 wt. %, preferably 0.4 to 1.0 wt. %.

EXAMPLES 107B to 126B

In each of Examples 107B to 126B, in a similar manner to Example 106B except that each of the compounds shown in Tables 30 was used for the electron injection transport layer 16a of FIG. 4, an organic thin-film EL device was formed and its properties were evaluated. The results are shown in Tables 30.

Even if any one of the above-described compounds were employed as the electron injection transport layer 16a, when the magnesium-lithium alloy cathode 17 had a lithium concentration ranging from 0.03 to 1.7 wt. %, luminous efficiency became about twice and luminance half-life became about three to four times when compared with those at a lithium concentration less than 0.03 wt. % or greater than 1.7 wt. %.

This suggests that, with respect to organic thin-film EL devices having the device structure shown in FIG. 4, when the compound represented by the formula (I) is used for the emitter layer 15 contiguous to the cathode 17, excellent advantages can be obtained at a lithium concentration adjusted to 0.03 to 1.7 wt. %. The adhesion of the cathode portion 17 was measured by peeling in the crosshatching test. The cathode 17 having a lithium concentration of 0.05 to 1.5 wt. % showed the highest load of 1500 to 1800 gf/24 mm, while that having a lithium concentration less than 0.05 wt. % showed the load of 550 gf/24 mm or less and that having a lithium concentration greater than 1.5 wt. % showed the load of 850 gf/24 mm or less.

The above results suggest that when the compound of the formula (I) is used for the electron injection transport layer 16a contiguous to the cathode 17, an improvement in adhesion is brought about by adjusting the lithium concentration in the magnesium-lithium alloy cathode 17 at 0.03 to 1.7 wt. % and at the same time, high efficiency and long-life light emission can be attained by disposing the cathode protective layer 18 over the cathode 17.

Comparative Example 4B

In a similar manner to Example 106B except that the electron injection transport layer 16a was formed using the conventionally and ordinarily used Alq, an organic thin-film EL device was formed and its properties were evaluated.

Figure 20:
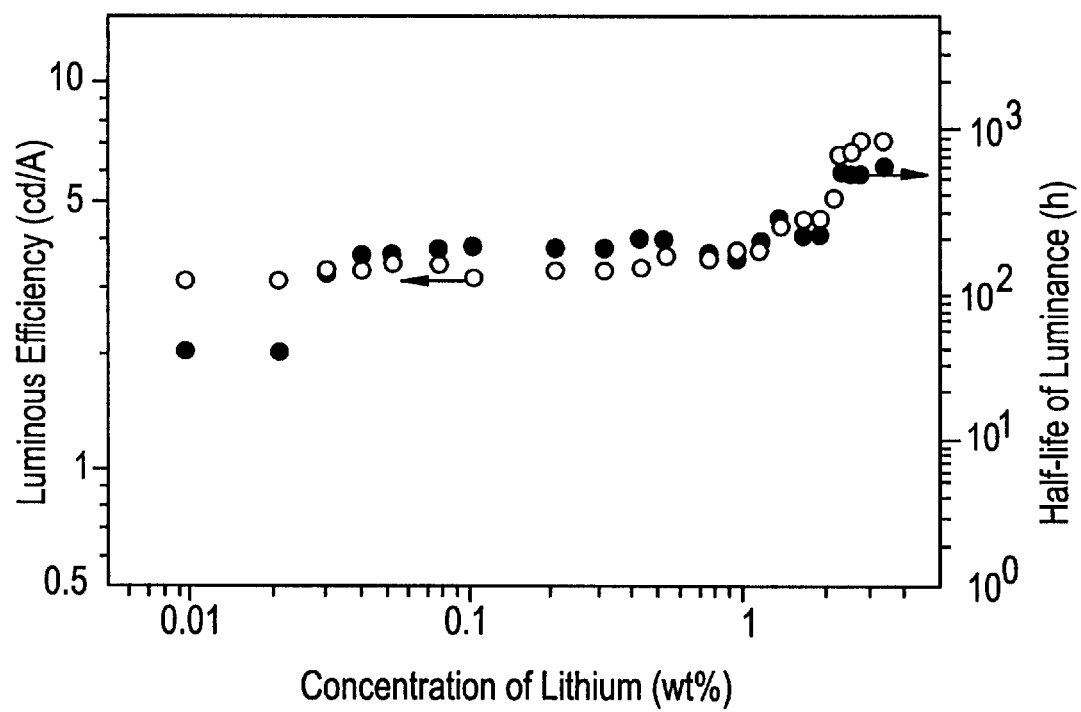
FIG. 20 is a graph illustrating luminous efficiency and luminance half-life of the cathode of Comparative Example 4B as a function of its lithium concentration.

As a result, it was observed, as illustrated in FIG. 20, that luminous efficiency and luminance half-life each showed a peak in a range of the lithium concentration exceeding 1.7 wt. %.

The adhesion of the cathode portion 17 was measured by peeling in the crosshatching test. As a result, the load was 1000 to 1200 gf/24 mm and showed the highest value when the cathode 17 having a lithium concentration exceeding 1.7 wt. % was employed, while it was 900 gf/24 mm when the cathode 17 having a lithium concentration not greater than 1.7 wt. % was employed.

TABLE 25

| | | Luminous Efficiency (Maximum Value) Relative to Li Concentration (cd/A) | | | Luminance Half-life (Maximum Value) Relative to Li Concentration (h) | | |
|---|---|---|---|---|---|---|---|
| | Compound No. | Less than 0.05 wt % | 0.05~ 1.5 wt % | More than 1.5 wt % | Less than 0.05 wt % | 0.05~ 1.5 wt % | More than 1.5 wt % |
| Example 1B | (1) | <2.4 | 6.1 | <2.8 | <100 | 1000 | <100 |
| Example 2B | (4) | <2.6 | 6.5 | <2.8 | <150 | 1100 | <120 |
| Example 3B | (5) | <2.6 | 6.0 | <2.6 | <150 | 1000 | <200 |
| Example 4B | (15) | <2.5 | 5.0 | <2.5 | <120 | 900 | <150 |
| Example 5B | (17) | <2.2 | 4.5 | <2.2 | <120 | 840 | <100 |
| Example 6B | (18) | <2.6 | 4.8 | <2.5 | <180 | 860 | <200 |
| Example 7B | (19) | <3.0 | 5.0 | <2.8 | <240 | 860 | <250 |
| Example 8B | (22) | <3.1 | 4.8 | <2.8 | <240 | 720 | <200 |
| Example 9B | (25) | <3.5 | 6.4 | <2.8 | <350 | 1000 | <300 |
| Example 10B | (26) | <3.5 | 6.0 | <3.2 | <320 | 950 | <260 |
| Example 11B | (29) | <3.0 | 4.5 | <3.2 | <240 | 720 | <240 |
| Example 12B | (32) | <3.2 | 4.8 | <3.0 | <300 | 850 | <300 |
| Example 13B | (48) | <3.0 | 5.5 | <2.8 | <240 | 700 | <200 |
| Example 14B | (62) | <3.0 | 5.2 | <3.1 | <200 | 750 | <250 |
| Example 15B | (63) | <3.0 | 4.9 | <2.8 | <250 | 620 | <240 |
| Example 16B | (66) | <2.5 | 4.8 | <2.3 | <220 | 600 | <200 |
| Example 17B | (69) | <3.0 | 5.0 | <3.2 | <320 | 650 | <280 |
| Example 18B | (70) | <2.6 | 5.5 | <3.0 | <350 | 740 | <240 |
| Example 19B | (72) | <2.3 | 5.0 | <2.8 | <240 | 500 | <180 |
| Example 20B | (80) | <2.4 | 4.5 | <2.3 | <200 | 450 | <120 |
| Example 21B | (82) | <2.0 | 4.2 | <1.8 | <160 | 330 | <120 |

TABLE 26

| | | Luminous Efficiency (Maximum Value) Relative to Li Concentration (cd/A) | | | Luminance Half-life (Maximum Value) Relative to Li Concentration (h) | | |
|---|---|---|---|---|---|---|---|
| | Compound No. | Less than 0.05 wt % | 0.05~ 1.5 wt % | More than 1.5 wt % | Less than 0.05 wt % | 0.05~ 1.5 wt % | More than 1.5 wt % |
| Example 22B | (83) | <2.2 | 4.6 | <2.4 | <100 | 380 | <100 |
| Example 23B | (84) | <2.0 | 4.0 | <1.8 | <100 | 480 | <240 |
| Example 24B | (86) | <2.2 | 4.2 | <2.8 | <240 | 580 | <200 |
| Example 25B | (87) | <2.0 | 3.8 | <1.8 | <24 | 240 | <24 |
| Example 26B | (93) | <1.6 | 2.8 | <1.4 | <72 | 280 | <48 |
| Example 27B | (96) | <1.5 | 2.9 | <1.6 | <72 | 280 | <72 |
| Example 28B | (107) | <1.7 | 3.6 | <1.4 | <100 | 500 | <120 |
| Example 29B | (119) | <2.0 | 3.6 | <1.8 | <120 | 480 | <240 |
| Example 30B | (121) | <2.0 | 3.2 | <1.6 | <72 | 360 | <72 |

TABLE 26-continued

| | | Luminous Efficiency (Maximum Value) Relative to Li Concentration (cd/A) | | | Luminance Half-life (Maximum Value) Relative to Li Concentration (h) | | |
|---|---|---|---|---|---|---|---|
| | Compound No. | Less than 0.05 wt % | 0.05~ 1.5 wt % | More than 1.5 wt % | Less than 0.05 wt % | 0.05~ 1.5 wt % | More than 1.5 wt % |
| Example 31B | (122) | <2.8 | 4.4 | <2.2 | <72 | 480 | <120 |
| Example 32B | (124) | <3.0 | 5.5 | <2.6 | <120 | 600 | <200 |
| Example 33B | (127) | <3.0 | 5.8 | <3.0 | <200 | 760 | <200 |
| Example 34B | (130) | <3.0 | 5.6 | <2.6 | <120 | 800 | <200 |
| Example 35B | (133) | <2.6 | 4.8 | <2.8 | <100 | 720 | <180 |
| Example 36B | (140) | <2.4 | 4.5 | <2.8 | <120 | 600 | <240 |
| Example 37B | (142) | <2.8 | 4.4 | <2.4 | <200 | 640 | <120 |
| Example 38B | (143) | <3.1 | 5.4 | <3.0 | <320 | 600 | <280 |
| Example 39B | (144) | <2.4 | 4.2 | <3.1 | <240 | 480 | <100 |
| Example 40B | (146) | <3.0 | 5.0 | <3.2 | <240 | 600 | <200 |
| Example 41B | (165) | <3.6 | 6.0 | <3.5 | <300 | 800 | <400 |
| Example 42B | (169) | <2.8 | 5.2 | <3.2 | <240 | 550 | <240 |

TABLE 27

| | | Luminous Efficiency (Maximum Value) Relative to Li Concentration (cd/A) | | | Luminance Half-life (Maximum Value) Relative to Li Concentration (h) | | |
|---|---|---|---|---|---|---|---|
| | Compound No. | Less than 0.05 wt % | 0.05~ 1.5 wt % | More than 1.5 wt % | Less than 0.05 wt % | 0.05~ 1.5 wt % | More than 1.5 wt % |
| Example 43B | (1) | <2.8 | 7.1 | <2.2 | <100 | 1200 | <100 |
| Example 44B | (4) | <4.3 | 8.4 | <4.0 | <400 | 1150 | <200 |
| Example 45B | (5) | <4.0 | 7.8 | <4.0 | <300 | 1100 | <200 |
| Example 46B | (18) | <3.5 | 6.5 | <3.8 | <300 | 900 | <240 |
| Example 47B | (19) | <3.8 | 6.2 | <3.9 | <320 | 1050 | <240 |
| Example 48B | (21) | <3.4 | 5.0 | <3.0 | <240 | 720 | <240 |
| Example 49B | (22) | <4.5 | 6.5 | <4.0 | <300 | 1000 | <400 |
| Example 50B | (25) | <4.8 | 7.4 | <3.5 | <350 | 950 | <400 |
| Example 51B | (26) | <4.0 | 6.5 | <3.2 | <200 | 900 | <280 |
| Example 52B | (48) | <3.8 | 6.2 | <2.8 | <200 | 760 | <240 |
| Example 53B | (66) | <3.8 | 6.8 | <3.8 | <300 | 840 | <300 |
| Example 54B | (69) | <3.5 | 6.0 | <3.0 | <400 | 900 | <480 |
| Example 55B | (70) | <4.2 | 5.2 | <2.4 | <180 | 720 | <200 |
| Example 56B | (72) | <3.4 | 5.6 | <3.2 | <120 | 750 | <240 |
| Example 57B | (80) | <3.0 | 4.8 | <2.8 | <200 | 660 | <320 |
| Example 58B | (82) | <2.8 | 4.8 | <2.6 | <100 | 500 | <120 |
| Example 59B | (83) | <3.0 | 5.4 | <2.8 | <200 | 600 | <240 |
| Example 60B | (84) | <3.4 | 6.0 | <3.0 | <240 | 880 | <800 |
| Example 61B | (86) | <3.4 | 6.2 | <3.5 | <120 | 680 | <240 |
| Example 62B | (87) | <3.5 | 5.8 | <2.8 | <200 | 400 | <48 |
| Example 63B | (93) | <3.1 | 6.0 | <3.6 | <200 | 720 | <240 |

TABLE 28

| | | Luminous Efficiency (Maximum Value) Relative to Li Concentration (cd/A) | | | Luminance Half-life (Maximum Value) Relative to Li Concentration (h) | | |
|---|---|---|---|---|---|---|---|
| | Compound No. | Less than 0.05 wt % | 0.05~ 1.5 wt % | More than 1.5 wt % | Less than 0.05 wt % | 0.05~ 1.5 wt % | More than 1.5 wt % |
| Example 64B | (108) | <3.8 | 6.5 | <3.4 | <400 | 1000 | <300 |
| Example 65B | (109) | <3.4 | 6.0 | <3.5 | <400 | 1100 | <360 |
| Example 66B | (119) | <3.2 | 5.3 | <2.8 | <360 | 850 | <400 |
| Example 67B | (121) | <2.2 | 4.0 | <2.8 | <120 | 600 | <200 |
| Example 68B | (124) | <3.2 | 6.8 | <3.3 | <300 | 1100 | <480 |
| Example 69B | (127) | <4.0 | 8.0 | <4.0 | <300 | 1250 | <500 |
| Example 70B | (130) | <3.5 | 6.2 | <3.6 | <300 | 960 | <300 |
| Example 71B | (133) | <3.5 | 6.0 | <3.0 | <200 | 720 | <240 |
| Example 72B | (135) | <3.0 | 5.0 | <3.1 | <240 | 600 | <200 |
| Example 73B | (140) | <3.2 | 6.5 | <3.2 | <200 | 700 | <300 |
| Example 74B | (142) | <2.6 | 4.6 | <3.1 | <120 | 550 | <100 |

TABLE 28-continued

| | | Luminous Efficiency (Maximum Value) Relative to Li Concentration (cd/A) | | | Luminance Half-life (Maximum Value) Relative to Li Concentration (h) | | |
|---|---|---|---|---|---|---|---|
| | Compound No. | Less than 0.05 wt % | 0.05~ 1.5 wt % | More than 1.5 wt % | Less than 0.05 wt % | 0.05~ 1.5 wt % | More than 1.5 wt % |
| Example 75B | (143) | <3.0 | 5.2 | <2.8 | <200 | 720 | <240 |
| Example 76B | (144) | <3.0 | 5.0 | <2.8 | <240 | 680 | <200 |
| Example 77B | (146) | <3.2 | 6.5 | <3.4 | <300 | 850 | <350 |
| Example 78B | (149) | <4.1 | 8.4 | <4.2 | <480 | 1250 | <300 |
| Example 79B | (150) | <3.2 | 7.0 | <3.2 | <400 | 1000 | <400 |
| Example 80B | (165) | <3.0 | 6.0 | <2.8 | <200 | 700 | <350 |
| Example 81B | (168) | <3.5 | 6.5 | <3.0 | <300 | 900 | <500 |
| Example 82B | (182) | <3.8 | 5.8 | <3.1 | <150 | 700 | <240 |
| Example 83B | (186) | <3.2 | 6.0 | <2.8 | <300 | 720 | <240 |
| Example 84B | (193) | <2.6 | 4.6 | <2.8 | <200 | 560 | <200 |

TABLE 29

| | | Luminous Efficiency (Maximum Value) Relative to Li Concentration (cd/A) | | | Luminance Half-Life (Maximum Value) Relative to Li Concentration (h) | | |
|---|---|---|---|---|---|---|---|
| | Compound No. | Less than 0.05 wt % | 0.05~ 1.5 wt % | More than 1.5 wt % | Less than 0.05 wt % | 0.05~ 1.5 wt % | More than 1.5 wt % |
| Example 85B | (1) | <3.8 | 8.1 | <3.2 | <100 | 960 | <400 |
| Example 86B | (4) | <4.5 | 8.6 | <3.8 | <400 | 1100 | <380 |
| Example 87B | (19) | <4.2 | 7.8 | <3.2 | <350 | 1000 | <420 |
| Example 88B | (22) | <4.0 | 7.2 | <3.1 | <280 | 960 | <300 |
| Example 89B | (25) | <4.5 | 8.2 | <3.8 | <500 | 1000 | <400 |
| Example 90B | (48) | <3.8 | 6.6 | <2.8 | <200 | 850 | <400 |
| Example 91B | (66) | <3.2 | 6.0 | <3.0 | <240 | 840 | <300 |
| Example 92B | (69) | <3.5 | 6.0 | <3.0 | <240 | 720 | <300 |
| Example 93B | (80) | <3.0 | 6.2 | <3.4 | <240 | 840 | <280 |
| Example 94B | (82) | <2.5 | 5.0 | <3.0 | <180 | 720 | <200 |
| Example 95B | (83) | <3.0 | 5.2 | <3.1 | <400 | 800 | <240 |
| Example 96B | (84) | <3.0 | 5.6 | <3.1 | <300 | 850 | <380 |
| Example 97B | (108) | <3.2 | 6.2 | <3.4 | <360 | 800 | <300 |
| Example 98B | (124) | <4.0 | 7.4 | <3.5 | <400 | 1100 | <480 |
| Example 99B | (127) | <4.0 | 7.5 | <4.0 | <580 | 1250 | <650 |
| Example 100B | (130) | <3.4 | 7.0 | <3.2 | <480 | 960 | <360 |
| Example 101B | (140) | <3.8 | 5.2 | <3.6 | <200 | 720 | <240 |
| Example 102B | (146) | <3.6 | 6.0 | <3.5 | <240 | 720 | <240 |
| Example 103B | (149) | <3.0 | 5.0 | <3.0 | <200 | 580 | <180 |
| Example 104B | (182) | <3.0 | 5.0 | <3.0 | <300 | 600 | <240 |
| Example 105B | (186) | <2.8 | 5.2 | <3.2 | <280 | 720 | <240 |

TABLE 30

| | | Luminous Efficiency (Maximum Value) Relative to Li Concentration (cd/A) | | | Luminance Half-life (Maximum Value) Relative to Li Concentration (h) | | |
|---|---|---|---|---|---|---|---|
| | Compound No. | Less than 0.05 wt % | 0.05~ 1.5 wt % | More than 1.5 wt % | Less than 0.05 wt % | 0.05~ 1.5 wt % | More than 1.5 wt % |
| Example 106B | (1) | <4.0 | 7.1 | <4.0 | <400 | 1300 | <400 |
| Example 107B | (4) | <4.8 | 8.4 | <4.0 | <400 | 1500 | <400 |
| Example 108B | (5) | <4.0 | 7.8 | <4.0 | <300 | 1400 | <400 |
| Example 109B | (19) | <3.8 | 6.2 | <3.9 | <320 | 1250 | <260 |
| Example 110B | (108) | <3.8 | 6.5 | <3.4 | <500 | 1200 | <400 |
| Example 111B | (109) | <3.4 | 6.0 | <3.5 | <450 | 1300 | <400 |
| Example 112B | (124) | <3.2 | 6.8 | <3.3 | <350 | 1300 | <600 |
| Example 113B | (127) | <4.0 | 8.0 | <4.0 | <330 | 1400 | <600 |
| Example 114B | (130) | <3.5 | 6.2 | <3.6 | <300 | 1150 | <350 |
| Example 115B | (133) | <3.5 | 6.0 | <3.0 | <240 | 800 | <280 |
| Example 116B | (137) | <3.2 | 5.0 | <2.5 | <200 | 580 | <240 |
| Example 117B | (179) | <3.0 | 6.0 | <3.0 | <280 | 720 | <300 |
| Example 118B | (182) | <3.8 | 5.8 | <3.1 | <200 | 800 | <300 |

TABLE 30-continued

| | | Luminous Efficiency (Maximum Value) Relative to Li Concentration (cd/A) | | | Luminance Half-life (Maximum Value) Relative to Li Concentration (h) | | |
|---|---|---|---|---|---|---|---|
| | Compound No. | Less than 0.05 wt % | 0.05~ 1.5 wt % | More than 1.5 wt % | Less than 0.05 wt % | 0.05~ 1.5 wt % | More than 1.5 wt % |
| Example 119B | (184) | <2.6 | 5.7 | <3.2 | <260 | 680 | <200 |
| Example 120B | (185) | <3.0 | 4.0 | <3.0 | <150 | 480 | <200 |
| Example 121B | (186) | <3.2 | 6.0 | <2.8 | <350 | 800 | <300 |
| Example 122B | (187) | <3.4 | 5.5 | <3.0 | <200 | 600 | <200 |
| Example 123B | (188) | <3.0 | 4.6 | <2.6 | <150 | 480 | <200 |
| Example 124B | (189) | <4.0 | 5.0 | <3.0 | <240 | 500 | <200 |
| Example 125B | (192) | <3.5 | 4.5 | <3.1 | <100 | 400 | <120 |
| Example 126B | (193) | <2.6 | 4.6 | <2.8 | <240 | 600 | <240 |

What is claimed is:

1. An organic thin-film EL device comprising an organic thin-film layer contiguous to the surface of a cathode opposite to an anode, wherein said organic thin-film layer is a charge injection transport layer and contains an organic compound represented by the following formula (I):

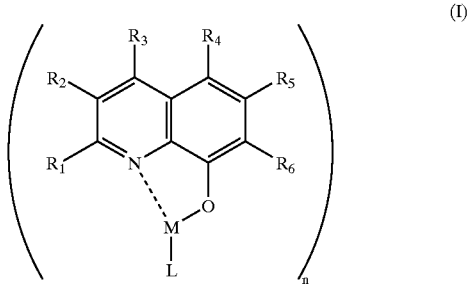

(I)

wherein $R_1$ to $R_6$ each independently represents a hydrogen atom, a halogen atom, an alkyl group, an alkoxy group or a cyano group; L represents a group —$OR_7$ in which $R_7$ represents an alkyl group, a cycloalkyl group, an aromatic group which may contain a nitrogen atom with a proviso that an unsubstituted phenyl group is excluded, an aromatic group having a bonding group composed of a metal atom or an oxygen atom or a ligand of an oxinoid compound having said bonding group; M represents a metal atom except for aluminum; and n stands for an integer of 1 or 2, and said cathode comprising aluminum as a main component and lithium in an amount of 0.05 to 1.5 wt. %, having a thickness of 1 to 50 nm and having a cathode protective layer thereon.

2. The organic thin-film EL device according to claim 1, wherein lithium has been doped into the organic thin film contiguous to said cathode.

3. The organic thin-film EL device according to claim 2, wherein the organic thin film layer contiguous to the cathode is an emitter layer.

4. The organic thin-film EL device according to claim 2, wherein the organic thin film layer contiguous to the cathode is an electron injection transport layer.

5. The organic thin-film EL device according to claim 1, wherein the cathode has a thickness of 1 to 50 nm and has a cathode protective layer thereon, said cathode protective layer is a single aluminum substance or an aluminum alloy.

6. The organic thin-film EL device according to claim 5, wherein the organic thin film layer contiguous to the cathode is an emitter layer.

7. The organic thin-film EL device according to claim 5, wherein the organic thin film layer contiguous to the cathode is an electron injection transport layer.

8. The organic thin-film EL device according to claim 1, wherein the organic thin film layer contiguous to the cathode is an emitter layer.

9. The organic thin-film EL device according to claim 1, wherein the organic thin film layer contiguous to the cathode is an electron injection transport layer.

10. The organic thin-film EL device according to claim 1, wherein said lithium is in an amount of 0.1 to 0.5 wt. %.

11. The organic thin-film EL device according to claim 1, wherein said lithium is in an amount of 0.15 to 0.5 wt. %.

12. The organic thin-film EL device according to claim 1, wherein said aluminum is 80 wt. % or greater.

13. The organic thin-film EL device according to claim 1, wherein said aluminum is 90 wt. % or greater.

14. An organic thin-film EL device comprising an organic thin-film layer contiguous to the surface of a cathode opposite to an anode, wherein said organic thin-film layer is a charge injection transport layer and contains an organic compound represented by the following formula (I):

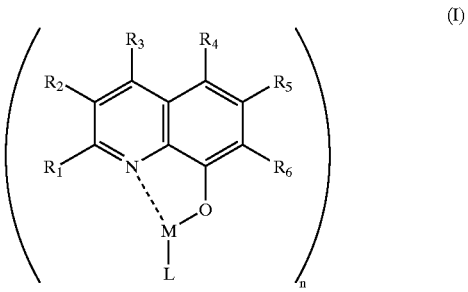

(I)

wherein $R_1$ to $R_6$ each independently represents a hydrogen atom, a halogen atom, an alkyl group, an alkoxy group or a cyano group; L represents a group —$OR_7$ in which $R_7$ represents an alkyl group, a cycloalkyl group, an aromatic group which may contain a nitrogen atom with a proviso that an unsubstituted phenyl group is excluded, an aromatic group having a bonding group composed of a metal atom or an oxygen atom or a ligand of an oxinoid compound having said bonding group; M represents a metal atom except for aluminum and n stands for an integer of 1 or 2, and said cathode comprising magnesium as a main component and lithium in an amount of 0.03 to 1.7 wt %, having a thickness of 1 to 50 nm and having a cathode protective layer thereon.

15. The organic thin-film EL device according to claim 14, wherein lithium has been doped into the organic thin film contiguous to said cathode.

16. The organic thin-film EL device according to claim 15, wherein the organic thin film layer contiguous to the cathode is an emitter layer.

17. The organic thin-film EL device according to claim 15, wherein the organic thin film layer contiguous to the cathode is an electron injection transport layer.

18. The organic thin-film EL device according to claim 14, wherein the organic thin film layer contiguous to the cathode is an emitter layer.

19. The organic thin-film EL device according to claim 14, wherein the organic thin film layer contiguous to the cathode is an electron injection transport layer.

20. The organic thin-film EL device according to claim 14, wherein said lithium is in an amount of 0.03 to 1.0 wt. %.

21. The organic thin-film EL device according to claim 14, wherein said lithium is in an amount of 0.4 to 1.0 wt. %.

22. The organic thin-film EL device according to claim 14, wherein said lithium is in an amount of 0.15 to 0.5 wt. %.

23. The organic thin-film EL device according to claim 14, wherein said magnesium is 80 wt. % or greater.

* * * * *